(12) United States Patent
Elberbaum

(10) Patent No.: US 8,594,965 B1
(45) Date of Patent: Nov. 26, 2013

(54) METHOD AND APPARATUS FOR CALIBRATING INTELLIGENT AC OUTLETS

(71) Applicant: David Elberbaum, Tokyo (JP)

(72) Inventor: David Elberbaum, Tokyo (JP)

(73) Assignee: Elbex Video Ltd., Tokyo (JP)

( * ) Notice: Subject to any disclaimer, the term of this patent is extended or adjusted under 35 U.S.C. 154(b) by 0 days.

(21) Appl. No.: 13/863,820

(22) Filed: Apr. 16, 2013

Related U.S. Application Data

(63) Continuation of application No. 13/661,492, filed on Oct. 26, 2012, now Pat. No. 8,442,792.

(51) Int. Cl.
*G01R 35/00* (2006.01)

(52) U.S. Cl.
USPC .......................................................... 702/107

(58) Field of Classification Search
USPC .......................................................... 702/107
See application file for complete search history.

(56) References Cited

U.S. PATENT DOCUMENTS

| | | | |
|---|---|---|---|
| 5,923,363 A | 7/1999 | Elberbaum | |
| 6,603,842 B2 | 8/2003 | Elberbaum | |
| 6,940,957 B2 | 9/2005 | Elberbaum | |
| 7,290,702 B2 | 11/2007 | Elberbaum | |
| 7,461,012 B2 | 12/2008 | Elberbaum | |
| 7,639,907 B2 | 12/2009 | Elberbaum | |
| 7,649,727 B2 | 1/2010 | Elberbaum | |
| 7,864,500 B2 | 1/2011 | Elberbaum | |
| 7,973,647 B2 | 7/2011 | Elberbaum | |
| 8,041,221 B2 | 10/2011 | Elberbaum | |
| 8,117,076 B2 | 2/2012 | Elberbaum | |
| 8,148,921 B2 | 4/2012 | Elberbaum | |
| 8,170,722 B1 | 5/2012 | Elberbaum | |
| 8,175,463 B2 | 5/2012 | Elberbaum | |
| 8,269,376 B1 | 9/2012 | Elberbaum | |
| 8,340,527 B2 * | 12/2012 | Elberbaum | .................. 398/113 |
| 2008/0266133 A1 * | 10/2008 | Martin | ..................... 340/870.02 |
| 2009/0251127 A1 * | 10/2009 | Kim | ............................ 324/76.11 |
| 2012/0120700 A1 | 5/2012 | Elberbaum | |
| 2012/0150461 A1 * | 6/2012 | Ohiwa et al. | ................... 702/60 |
| 2012/0262006 A1 | 10/2012 | Elberbaum | |

OTHER PUBLICATIONS

Specification and Drawings of U.S. Appl. No. 13/349,939.
Specification and Drawings of U.S. Appl. No. 13/599,275.
United States Office Action dated Jan. 29, 2013, from corresponding U.S. Appl. No. 13/661,492.

* cited by examiner

*Primary Examiner* — Tung S Lau
*Assistant Examiner* — Xiuquin Sun
(74) *Attorney, Agent, or Firm* — Katten Muchin Rosenman LLP

(57) ABSTRACT

A method and apparatus for measuring and calibrating the power consumption reporting by intelligent AC outlets, sub outlets and sockets including optoport and RFID antenna using a hand held loader and propagating optical signals via a lightguide or fiber optic cable and via RFID signals and tags, including the setting up of location, AC outlet identification and appliance particulars. Simpler loaders or calibrators communicate standard power consumption values to the AC outlet for self-calibration using the received values. The appliance particulars are introduced via the loader keys or a touch screen and via the reading of a RFID tag attached to the plug of an appliance and processed via the loader for propagation through an optical grid of a residence automation system via current drain or power consumption receivers.

11 Claims, 12 Drawing Sheets

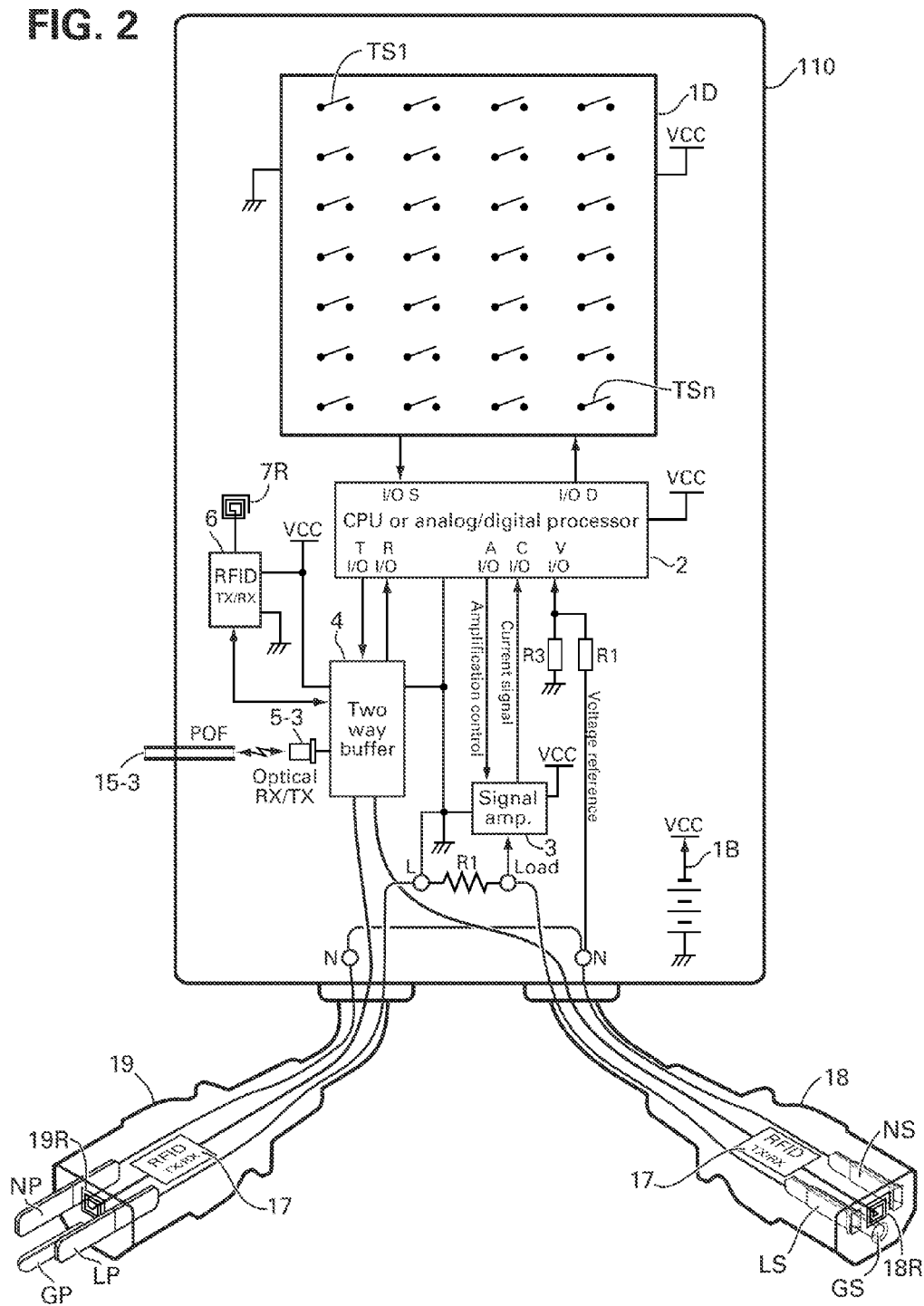

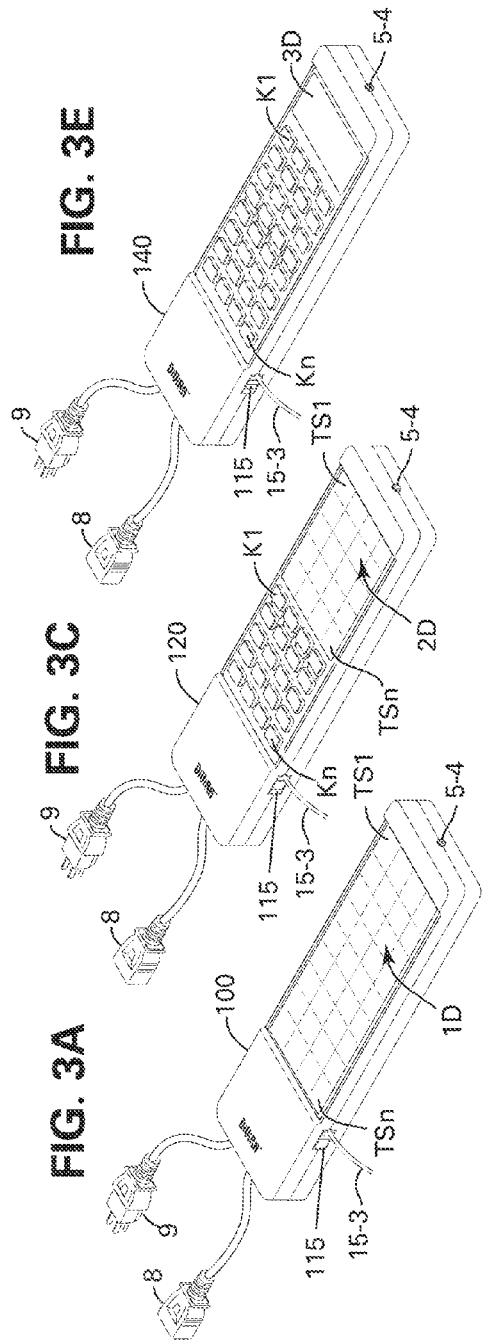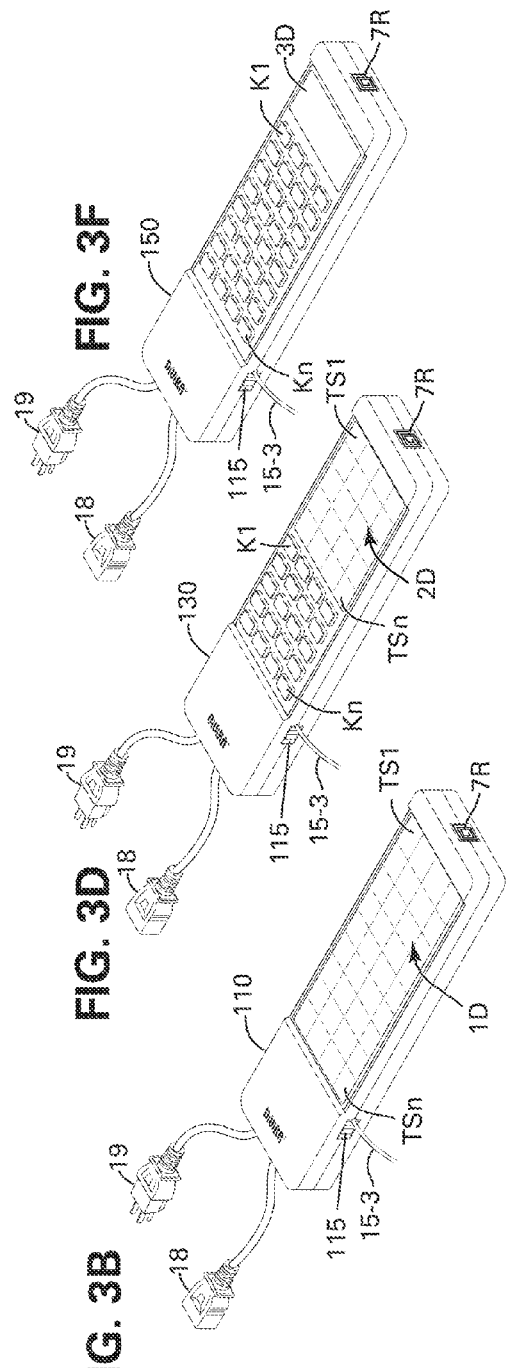

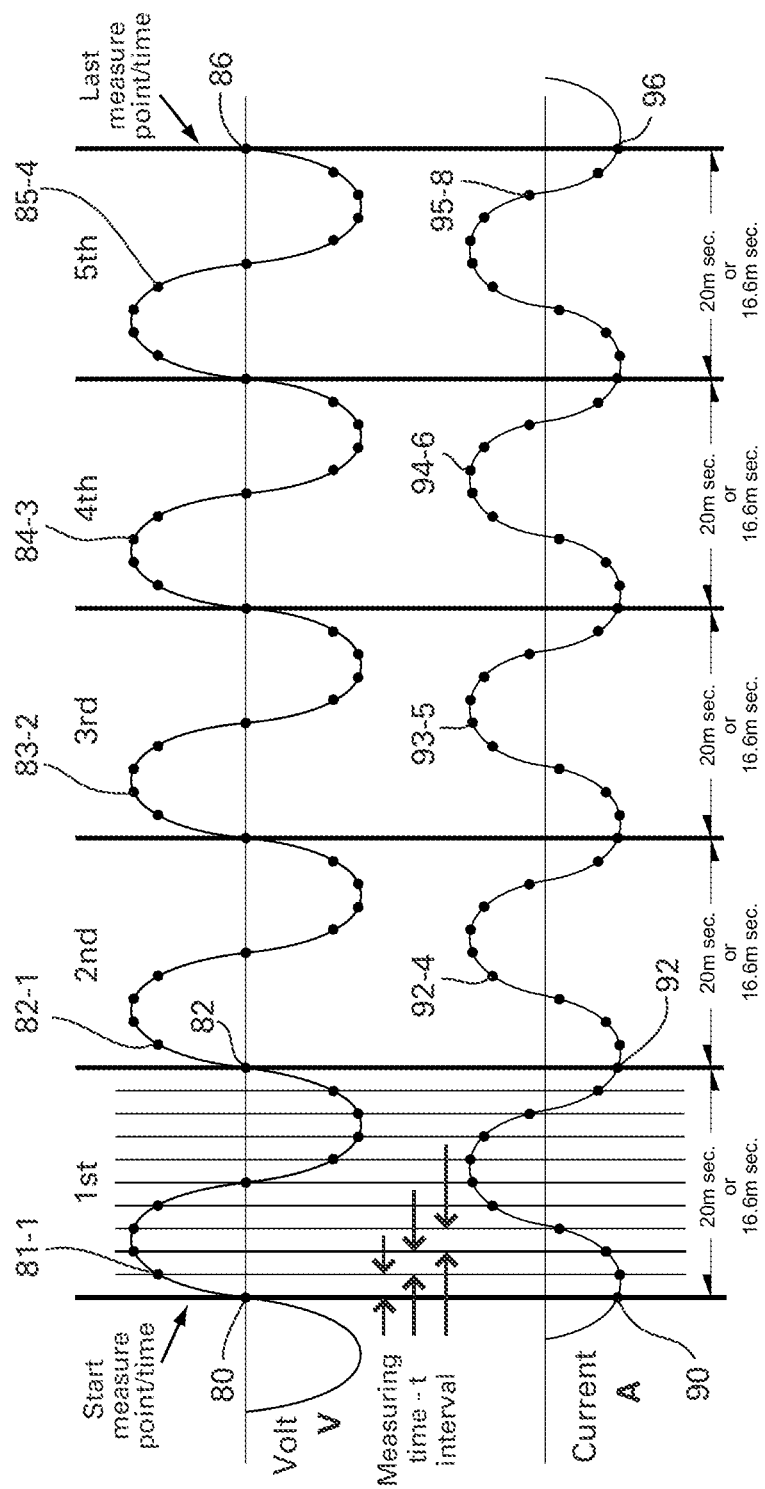

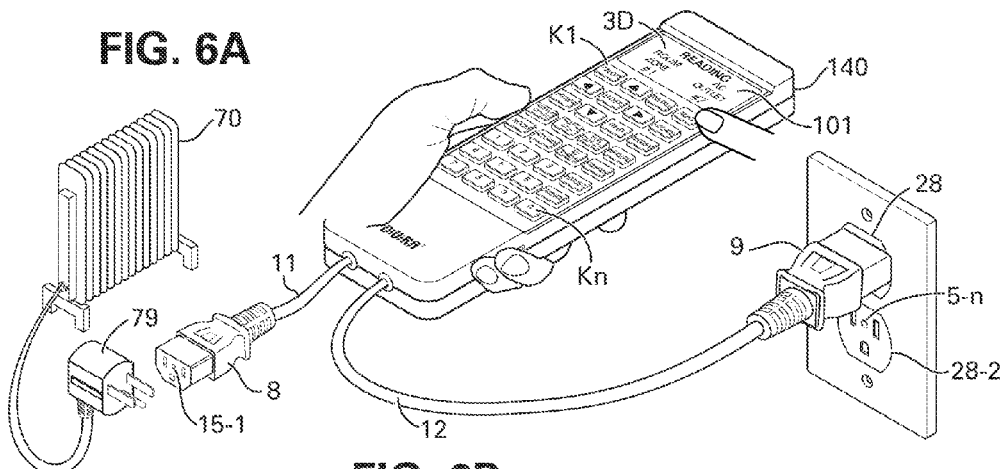
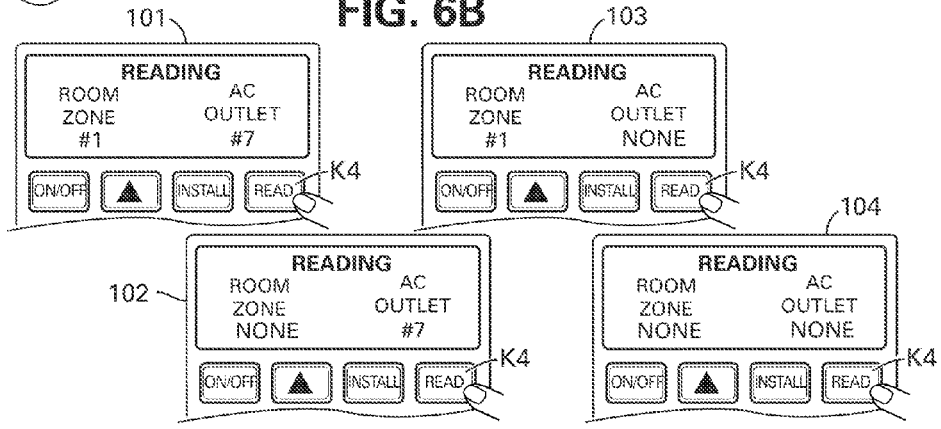
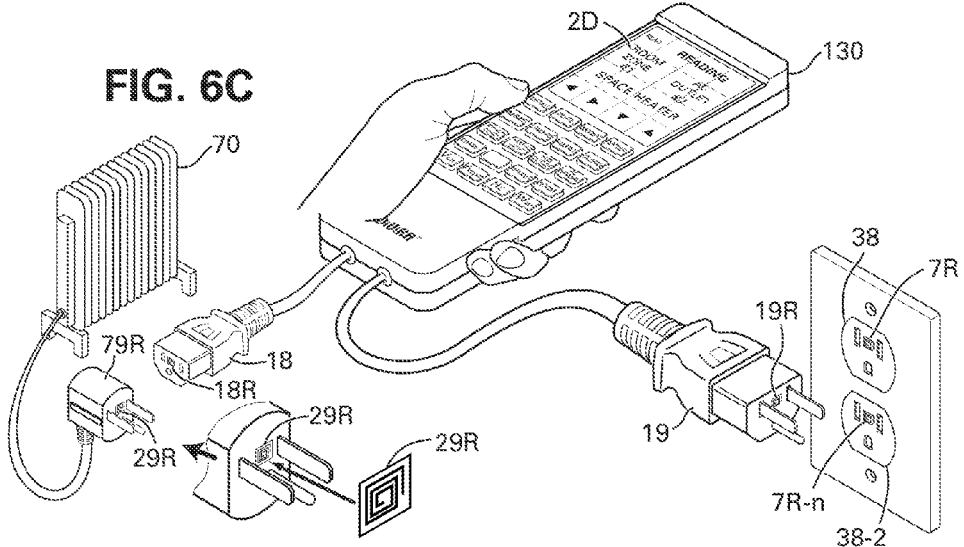

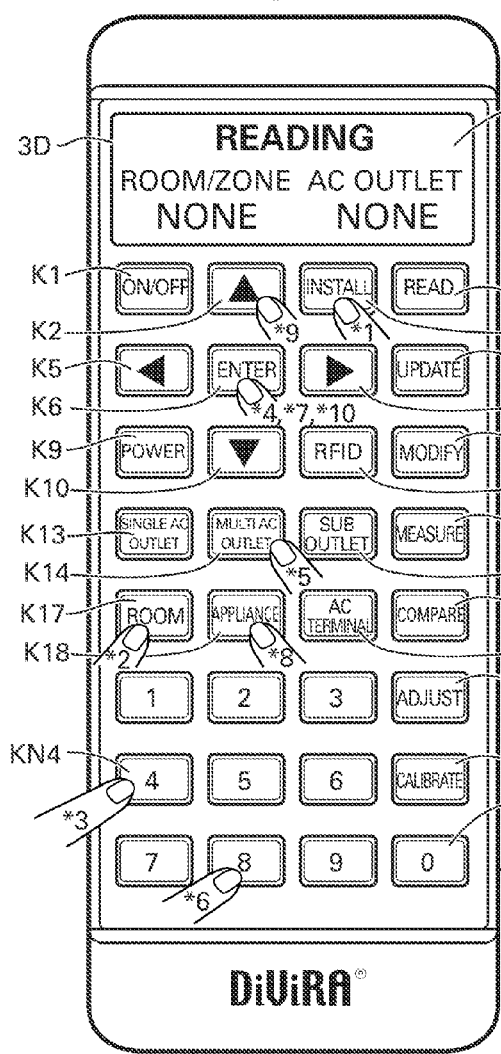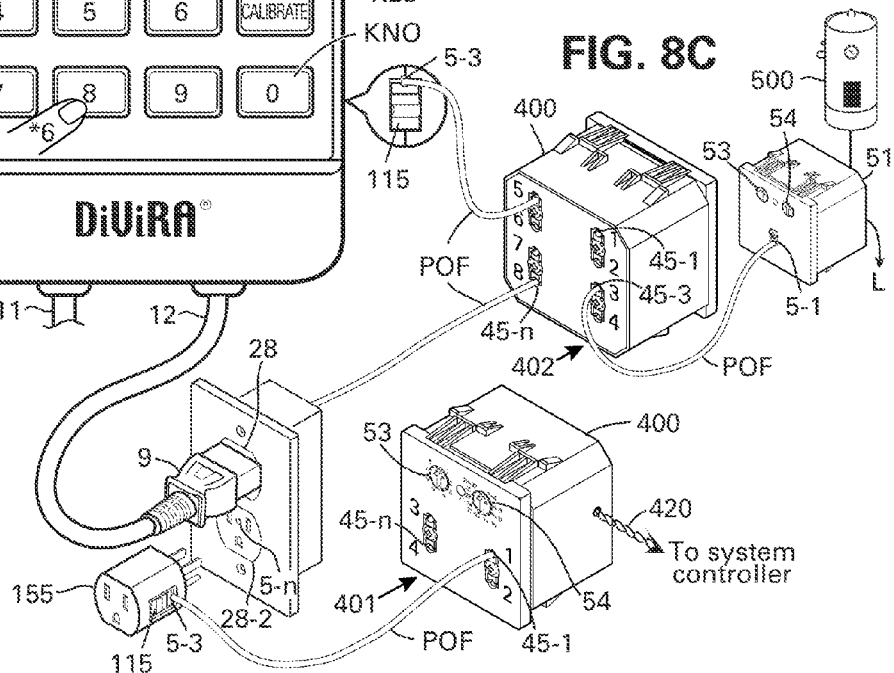

FIG. 10A

APPLIANCE CODES — 700

| KITCHEN/DINNING | | | AUDIO/VIDEO | | PC, TEL & PHOTO | |
|---|---|---|---|---|---|---|
| Bread slicer | 0x00 | 0x23 | Bluray | 0x46 | Battery charger | 0x67 |
| | 0x01 | Meat chopper | 0x24 | 0x47 | | 0x68 |
| Can opener | 0x02 | Meat mincer | 0x25 | CD | 0x48 | Calculators | 0x69 |
| Cheese slicer | 0x03 | Meat slicer | 0x26 | | 0x49 | Camera | 0x6a |
| Coffee maker | 0x04 | Microwave oven | 0x27 | Disk player | 0x4a | Copy machine | 0x6b |
| Coffee mill | 0x05 | Milk warmer | 0x28 | DVD | 0x4b | | 0x6c |
| Cooking plate | 0x06 | Mixer | 0x29 | | 0x4c | Fax machine | 0x6d |
| | 0x07 | | 0x2a | Game box | 0x4d | | 0x6e |
| Deep fry pan | 0x08 | Noodle maker | 0x2b | | 0x4e | Interphone | 0x6f |
| Dish dryer | 0x09 | | 0x2c | Home theater | 0x4f | | 0x70 |
| Dishwasher | 0x0a | Oven | 0x2d | | 0x50 | Mobile phone | 0x71 |
| | 0x0b | | 0x2e | iPod cradle | 0x51 | | 0x72 |
| Egg cooker | 0x0c | Range | 0x2f | | 0x52 | Router/hub | 0x73 |
| Espresso | 0x0d | Refrigerator | 0x30 | MP3 | 0x53 | | 0x74 |
| | 0x0e | Rice cake maker | 0x31 | Music box | 0x54 | PC | 0x75 |
| | 0x0f | Rice cooker | 0x32 | | 0x55 | PC Printer | 0x76 |
| Fish roaster | 0x10 | Rice jar | 0x33 | Portable player | 0x56 | Power supply | 0x77 |
| Food processor | 0x11 | Rice washer | 0x34 | | 0x57 | Photo Printer | 0x78 |
| Freezer | 0x12 | Roaster | 0x35 | Radio | 0x58 | | 0x79 |
| Fryer | 0x13 | | 0x36 | | 0x59 | | 0x7a |
| | 0x14 | Steamer | 0x37 | Stereo pre amp. | 0x5a | Scanner | 0x7b |
| Grinder | 0x15 | Stirrer | 0x38 | Stereo amp. | 0x5b | Smartphone | 0x7c |
| Garbage disposal | 0x16 | Stove | 0x39 | | 0x5c | | 0x7d |
| | 0x17 | | 0x3a | TV set top box | 0x5d | Tablet PC | 0x7e |
| Ice flaker | 0x18 | Tea server | 0x3b | Television | 0x5e | Telephone | 0x7f |
| Ice maker | 0x19 | Toaster | 0x3c | | 0x5f | | 0x80 |
| Induction cooker | 0x1a | Tumblers dryer | 0x3d | Video Camera | 0x60 | | 0x81 |
| Instant water heater | 0x1b | | 0x3e | VCR | 0x61 | Wi-Fi router | 0x82 |
| | 0x1c | Vegetable washer | 0x3f | | 0x62 | | 0x83 |
| Juice blender | 0x1d | | 0x40 | MUSIC | | CONTROLLERS | |
| Juice squeezer | 0x1e | Waffle iron | 0x41 | Juke box | 0x63 | Heating Regulators | 0x84 |
| | 0x1f | Warm tray | 0x42 | | 0x64 | | 0x85 |
| Kettle/pot | 0x20 | Warming board | 0x43 | | 0x65 | Smoke Detector | 0x86 |
| | 0x21 | Water cooler | 0x44 | Musical instrument | 0x66 | Thermostats | 0x87 |
| | 0x22 | | 0x45 | | | | |

FIG. 10B

APPLIANCE CODES — 701

| ENVIRONMENTAL | | | | DIY TOOLS | |
|---|---|---|---|---|---|
| Air cleaner | 0x88 | Sunshades | 0xa7 | Shaver | 0xc4 | Drill | 0xe3 |
| Air condition | 0x89 | Sliding shutters | 0xa8 | Skin care heater | 0xc5 | | 0xe4 |
| Blower | 0x8a | LAUNDRY | | | 0xc6 | Electric vehicle | 0xe5 |
| | 0x8b | | 0xa9 | Toothbrush | 0xc7 | | 0xe6 |
| Circulation fan | 0x8c | Clothes presser | 0xaa | HEATER (fixed) | 0xc8 | Grinder | 0xe7 |
| Cool air fan | 0x8d | Clothes steamer | 0xab | Carpet | 0xc9 | Heating tools | 0xe9 |
| | 0x8e | | | | | | 0xe9 |
| Dehumidifier | 0x8f | Dryer | 0xac | | 0xca | Incense burner | 0xea |
| Deodorizer | 0x90 | Flat iron | 0xad | Heating board | 0xcb | | 0xeb |
| | 0x91 | | 0xae | Heating sheet | 0xcc | Plastic welder | 0xec |
| Humidifier | 0x92 | Iron | 0xaf | Heating mat | 0xcd | | 0xed |
| | 0x93 | | 0xb0 | Hot-air heater | 0xce | Saw | 0xee |
| Room fan | 0x94 | Spin extractor | 0xb1 | | 0xcf | Sawing machine | 0xef |
| Ventilation fan | 0x95 | Washing machine | 0xb2 | Immersion heater | 0xd0 | Screwdriver | 0xf0 |
| | 0x96 | | 0xb3 | | 0xd1 | Soldering iron | 0xf1 |
| LIGHTS | 0x97 | HEALTH CARE | 0xb4 | Oil heater | 0xd2 | | 0xf2 |
| | 0x98 | Inhalator | 0xb5 | Room heater | 0xd3 | Welder | 0xf3 |
| Ceiling | 0x99 | Mist sprayer | 0xb6 | Space heater | 0xd4 | | 0xf4 |
| | 0x9a | Wheel chair | 0xb7 | | 0xd5 | | 0xf5 |
| Desk top | 0x9b | PERSONAL CARE | 0xb8 | HEATER (portable) | 0xd6 | | 0xf6 |
| | 0x9c | | | | 0xd7 | | 0xf7 |
| Floor | 0x9d | | 0xb9 | Blanket | 0xd8 | | 0xf8 |
| | 0x9e | | 0xba | Floor cushion | 0xd9 | | 0xf9 |
| Portable | 0x9f | Curling iron | 0xbb | Foot warmer | 0xda | | 0xfa |
| Pedestal | 0xa0 | Hair care heater | 0xbc | | 0xdb | | 0xfb |
| | 0xa1 | Hair clipper | 0xbd | Heated chair | 0xdc | | 0xfc |
| WINDOWS | | Hair curler | 0xbe | | 0xdd | | 0xfd |
| Blinds | 0xa2 | Hair dryer | 0xbf | Knee rug | 0xde | | 0xfe |
| | 0xa3 | Hair steamer | 0xc0 | | 0xdf | | 0xff |
| Curtains | 0xa4 | | 0xc1 | Seat cover | 0xe0 | | |
| | 0xa5 | Nail polisher | 0xc2 | Slippers | 0xe1 | | |
| | 0xa6 | | 0xc3 | | 0xe2 | | |

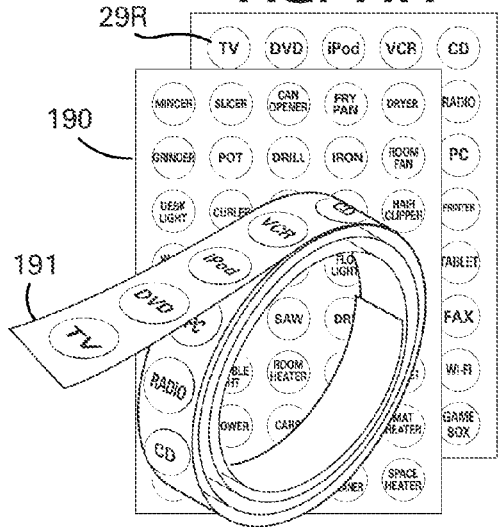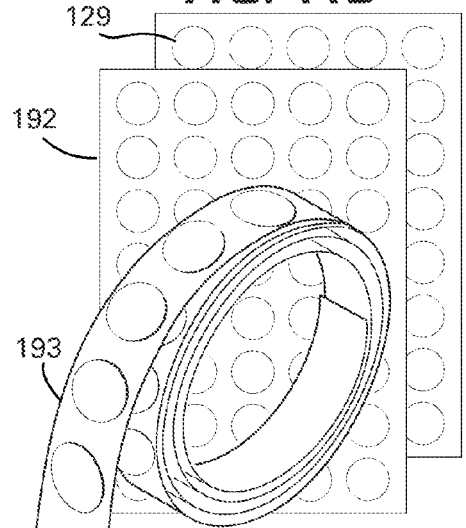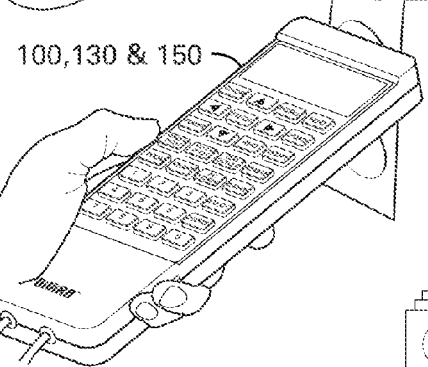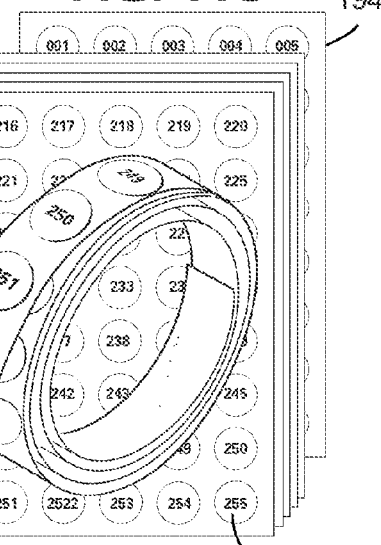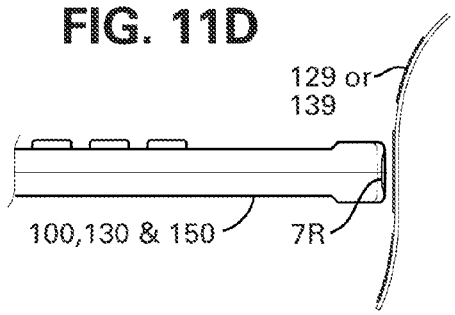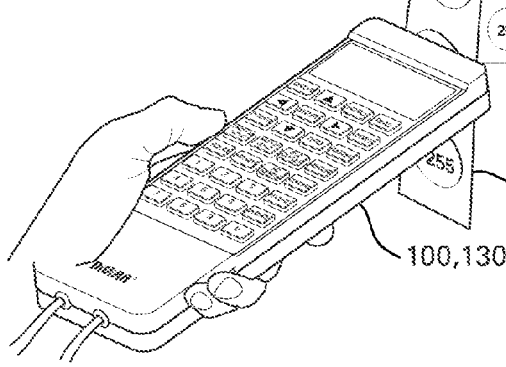

METHOD AND APPARATUS FOR CALIBRATING INTELLIGENT AC OUTLETS

BACKGROUND OF THE INVENTION

1. Field of the Invention

This invention is related to a method and an apparatus for measuring and updating data pertaining to electric power consumed by a load through power outlets and terminals via optical and RFID signals.

2. Description of the Prior Art

AC power outlets, AC power cable assemblies and other AC power sources that are the power connecting points in residences, businesses, industry, entertainment and public facilities including hotels and other buildings do not provide and/or generate data pertaining the electrical power being consumed or current being drained through them, be it by a random load or by appliances that are fixedly connected to the AC power such as lights, HAVC and boilers.

The demand for power saving and consumption reporting is becoming a global issue that needs to be addressed. Electrical systems and devices should be provided with the circuits for reporting power consumption, current drain and/or appliance statuses. Such circuits, including intelligent reporting AC outlets are disclosed in the U.S. Pat. Nos. 7,639,907, 7,649,727, 7,864,500, 7,973,647, 8,041,221, 8,148,921, 8,170,722, 8,175,463, 8,269,376 and in the U.S. patent application Ser. Nos. 12/945,125, 13/086,610 and 13/349,939.

Dedicated controllers, video interphone monitors and shopping terminals for communications within a building pertaining current drain, power consumption and appliances statuses including the reporting of such data via the Internet and other networks are disclosed in the U.S. Pat. Nos. 6,603,842, 6,940,957, 7,461,012, 8,117,076 and the U.S. patent application Ser. No. 13/599,275. All listed above patents and applications are incorporated herein by reference.

The disclosed AC outlets and other AC power sources need to be updated at times, particularly with the need to verify the power consumed values. The consumed AC power value is calculated on the basis of the current drain and the measured voltage which mandates the measuring of both the voltage level and the current value along the AC sinusoidal curve at high speed intervals.

The sinusoidal curve of the AC power line is distorted due to uneven loads, switching power supplies and other nonlinear loads affecting the shape of the sinusoidal curve, at each AC outlet, sub outlet or other AC terminals.

As the AC distortion by the loads are being changed at random and/or their current drain value changes over time the accuracy of the measured power consumption at the source need to be checked and calibrated. Each intelligent AC outlet and other AC current drain reporting device, be it via lightguide (POF), fiber optic cable, RF, IR or low voltage bus line, the AC outlet must be updated with a given load, the appliance particulars and the measured power consumption must be calibrated.

The AC outlet particulars, including sub outlets and the particulars of the connected appliance or the load consuming the power, including any other reported data must be formed into a simple code or command. Moreover, the updating and/or the calibrating hand tool, termed loader or calibrator, is made such that tenants or dwellers that are not technical savvy will be able to operate comfortably. It is the tenants or dwellers that need to process the loading, updating, upgrading, adjusting and/or calibrating without the help of an electrician or a communication IT expert.

The loader or the calibrator should be a low cost device, such that the user can afford to keep at his residence or office, for updating and calibrating AC outlets regularly when an appliance is being plugged into the AC outlet. Or keep it just for random use when updates are needed.

The use of an IR remote control for optically updating appliances and AC outlets particulars for identifying the appliances, the outlets and their locations are disclosed in the above US patents, specifically in U.S. Pat. Nos. 8,041,221, 8,148,921 and 8,170,722. However all the disclosed remote controls are used for updating particulars of the AC outlets, appliances and light bulbs, but not for adjusting, calibrating and/or verifying the power consumption reporting. A single simple to use and a low cost device is needed for the updating, adjusting and calibrating the power reporting accuracy, including the updating of home automation operation particulars and controls.

SUMMARY OF THE INVENTION

It is the object of the present invention to provide a simplified method and apparatus for loading, updating, adjusting and calibrating AC devices at the source point, such as AC outlets, AC current sensors and other AC wiring devices including switches, dimmers, AC power breakers and AC controllers such as controllers for curtains or heaters or air conditioners that include current sensing circuits and/or power consumption reporting circuits.

The terms adjusting, adjustment, calibrating or correcting hereafter refer to a procedure to ensure that the adjusted, calibrated or corrected AC device will output a coded signal representing accurately the current drained and/or the AC power consumed through it.

The term coded signal hereafter refers to coded signals including optical signal comprising visual light or IR propagated via lightguide, optical fiber cable and combination thereof, optical signal comprising UV, visual light, IR and combination thereof propagated in air in line of sight, RF signal propagated in air including RFID propagated in closed proximity and low voltage electrical signal propagated via bus line and other communication lines.

The term install is a term used for fresh loading of data or for loading, updating, modifying, adjusting or calibrating data stored in a memory hereafter refers to a data comprising said coded signal for identifying said AC device itself and/or the power consumed or the current drained by a load connected to it, randomly and/or permanently and/or for data identifying the load.

The term load hereafter refers to an appliance that consumes electrical power and/or draining current through an AC device directly or via an extension power cable or power cable assembly comprising a plurality of AC socket. The plurality of AC outlets of cable assembly or of an extension power cable assembly or of an AC outlet adaptor comprising plurality of AC sockets, each such socket is termed hereafter a sub outlet or socket.

The term AC device, or AC outlet, or sub outlet, or socket, or AC terminal hereafter refers to an intelligent AC device, an intelligent AC outlet, an intelligent socket, an intelligent sub outlet and an intelligent AC terminal comprising current sensing and/or power consumption measuring, calculating and communicating circuits. The term AC outlet hereafter and in the claims covers any and all other intelligent AC devices unless the term is specifically identified as such.

The term communicating circuits include one way or two way communication drivers and input/output elements or ports for exchanging, receiving or transmitting the coded signals.

The terms loader, calibrator, opto loader, RF loader, RFID loader and power setter refer to a hand held units of the present invention including the accessories forming together the apparatus for calibrating the intelligent AC devices and the loads powered through them, including the adjusting and/or calibrating the accuracy of the communicated data pertaining to the current drained or the power consumed via the AC devices to a current drain receiver, power consumption data receiver and a combination thereof.

The switching of a load on and off by transmitting a visual light signal, such as a red (650 nm) light signal generated by an LED of a control device to a photo receiver of an AC switching device connected to a load or to a photo receiver of the load via a lightguide is a basic feature of the referenced US patents and applications. The other features are the connection simplicity of lightguides to appliances via their power cables, plugs and sockets and the simple attachment process of lightguide to AC devices for exchanging the on-off and more elaborated commands for operating the appliances.

The use of optical signals comprising visual light, UV or IR signals, introduces a new medium for the home automation and control, including confirmation, the detailed electrical systems power consumption and statuses reporting at real time are the other features of the referenced US patents and applications.

The lightguides or the plastic optical fiber or POF offer the most efficient communication solutions and immunity to Electro Magnetic Interference (EMI), unlike the need to insulate and shield control signals in copper cables from EMI, or insulate an RF signal from interferences or cross talk noises and disturbances within the electrical boxes, wirings and system, is the another advantage for using optical signal as the main transport of signals.

The need to electrically insulate the signal cables from the power lines, elements and devices that feed AC and/or DC power to appliances, including power switches, light dimmers, AC outlets, AC socket, AC sub sockets and other AC and/or DC power devices is an absolute must and a major obstacle in mixing or mingling low voltage control wires with power wires and devices.

Mingling low voltage lines with AC wiring devices is prohibited by the building and the electrical codes and the use of lightguides, known as plastic optical fiber (POF), being a nonflammable and a perfect insulator, is yet another major advantage of the referenced US patens and the references in the pending applications to an optical grid.

Further, AC power devices may include an AC or DC current sensor or sensing circuit including optical transceivers for outputting optical signal of a given current drain and state, such as on-off state, stand-by state or provide current drain levels data, such as disclosed in the referenced US patents and applications.

Another object of the referenced US patents and applications is to operate and monitor the state of lights and appliances including the real time monitoring of the entire electrical consumption within the residence or office or other premises through a video interphones and/or "shopping terminals" and/or via a communication network.

The use of communication networks or the Internet enables the propagation of control codes and signals via the video interphones and/or the shopping terminals and/or by other dedicated controllers to operate and receive statuses and power consumption from the different appliances.

The using of an IR driver and RF drivers circuits as described in the U.S. Pat. Nos. 7,639,907, 7,649,727, 7,864,500 or other driver circuits enables an unattended control of appliances and loads. "Shopping terminals" are disclosed in the U.S. Pat. Nos. 7,290,702 and 8,117,076. Video interphones systems are disclosed in U.S. Pat. Nos. 5,923,363, 6,603,842 and 6,940,957.

The term appliance refers to any and all AC or DC operated appliances, products and machines, such as A/V appliances including television, A/V recorders, music, and peripherals; PC and peripherals such as printer, a hub and a router; air condition, heater, environment equipment and sensors; water boilers, kitchen appliances, laundry appliances and garden appliances; curtains, shutters and blinds; lights including incandescent, fluorescent and LED; security devices including cameras, recorders, access control, fire, gas and intruder sensors and peripherals; any other AC or DC powered products that can be remotely operated or that respond to and can communicate their operating status, including propagating data of current drain, power consumption and statuses through their power cable, power plug, power socket and power outlet.

The terms plug, plugged, plugging, attaching, attached, mated and mating refer to the act of connecting or joining an AC plug to an AC socket. The terms mated and mating are mainly used in the claims to describe the act of introducing an RFID tag of an AC plug into an RFID antenna of an AC socket by joining the plug with the socket.

The terms file, files, page and pages refer to the memory files and pages of the CPU included in the AC outlets and terminals and in the loader or calibrator.

The terms photo, or opto, or optical relating to elements, parts, structure and techniques in the following description are one of the same.

The term lightguide coupler refers to a semiconductor circuit structure incorporating optical transmitter and/or optical receiver and/or optical transceiver and/or photovoltaic cell including an optical access aligned with the optical receiver, or the optical transmitter or the optical transceiver. The optical access is also termed hereafter as optoport.

The optoport structure may include (built-in) lightguide holder structure for introducing the lightguide or an optical fiber cable to the optical access, or such lightguide holder may be a separate structure for attachment to the photo coupler package and access.

The term live AC refers to the "hot line" of the AC power or mains, as opposed to the neutral line of the AC power or mains.

The term transmitter refers to an LED, laser or other optical emitting devices that transform electric signals into UV, IR or visual light signals, or to an electric signal transmitter for transmitting electrical signals via low voltage bus line, RF in air or RFID in close proximity.

The term transmitting or propagating an optical signal refers to a UV, IR or visual light emission from a transmitter, in air such as from hand held remote control or into lightguides or into an optical grid of lightguides or fiber optic cables.

The term receiver refers to a photo diode, pin diode, photo transistor, CMOS, CCD or other photovoltaic or photoelectric receivers that convert UV, IR or visual light into electrical signals or electrical charge, or to an electrical signal receiver for receiving low voltage coded signal via bus line, RF signal in air or RFID in close proximity.

The term receiving optical signal refers to the receiving of UV, IR or visual light, in air in line of sight, such as from an hand held IR remote control or from a loader, or via lightguides or optical fibers onto an optoport or an optical receiving surface of the receiver directly or via a transparent materials including prisms, half mirrors, lenses, filters and other optical structures.

The term transceiver refers to a combined transmitter and receiver including a transceiver embedded into a semiconductor package or attached to an optical prism for propagating two way optical signals through a single optical cable such as the lightguides or the optical fibers by deflecting or directing a received optical signal to the receiver and allowing the transmitted optical signal to pass into the optical cable. The term transceiver includes a transceiver that propagates two way optical signals via two optical cables or for a transceiver for exchanging low voltage electrical signal via bus line, RF signal in air or RFID in close proximity.

The term optical prism refers to a structure for deflecting and/or separating two way optical signals (the received and the transmitted optical signals) propagated via the prism to and from a single lightguide or optical fiber.

Said prism comprises an optical device selected from a group of polarizing optical filters, given visual wave length pass filters, visual band pass filters, given wave length UV pass filters, given wave length IR pass filters, given wave length UV cut filters, given wave length IR cut filters, half mirrors with a given reflectance values and combinations thereof, wherein said filters and/or said half mirrors form said prism or are attached to said prism and/or are coated onto said prism and/or are introduced into the prism material in the form of a tint, particles or a process.

A prism structure similar to the structure disclosed in the U.S. Pat. No. 8,175,463 is a molded clear plastic structure for aligning photo transmitter and photo receiver into the center of the optical access for directly linking the transmitter and the receiver in line into a single terminated end of a lightguide or fiber optic cable.

Even though an UV, IR or visual light may be recited individually in the following descriptions, the UV, IR and the visual light term may refer to all. The term light, UV, IR or visual light is used alternately to an optical signal and should not be restrictive to the one or the other, unless it is so described.

The current drain data or the on-off state data is generated and propagated in response to the received operational command, such as on-off, or in response to an inquiry command (a request for data) on the basis of the current sensor output, or in response to a change in the detected current drain above a given parameter, thereby providing error free remote controlling and status reporting of lighting and appliances.

Further, the current drain, the power consumption and other data that are propagated in response to a power-on command by confirming that the load is switched on, is a perfect solution for controlling the energy consumption in real time, and for providing error free energy management. By such return confirmation the home automation controller, the video interphone or the shopping terminal are updated at all times with illuminators and other appliance's "on state", or "off state" when the command was to switch off the appliance.

It is preferable that the IR, RF or RFID addressing and commands are appended or annexed to the codes such as the codes shown in U.S. Pat. No. 8,170,722 that are common with wired commands via bus lines and/or with the optical signals propagated via lightguides. Similar appended commands are preferably apply to an RF remote control signals used for A/V appliances.

The IR signals use low frequency clock 38 KHz~100 KHz, with 38.5 KHz being the most popular clock frequency. The disclosed U.S. Pat. No. 7,639,907 referred to above, generate different clock frequencies, addresses, protocols and commands for controlling literally every IR remote controlled appliance.

The referenced US patents and application provide circuits and memory for reading and storing the commands from the original IR or RF remote control units, supplied with the different appliances. Another method is the downloading of the many openly published protocols and commands, including the downloaded codes and integrating the IR and RF remote control command into the coding program as updated on the basis of the appliance location within the premises.

This object of the present invention is attained by a simple loader for recording the location of the appliance's AC outlets within the premises or the location "addresses" and other particulars into the AC devices and/or into the appliances. This setting includes manual digital switches and/or the loading of the location address, such as room number through a program embedded into the original remote control unit of the appliance.

The loader provide for setting addresses and other particulars to the appliances, such a TV in a room number 1~8 and to the lighting fixtures including the associated AC outlets, the AC switches, the AC sockets, the AC plugs, the in wall controllers, the current sensors and other wiring devices, elements and peripherals.

The loaders and the programs enable to setup an error free, simplified reliable indexing for the identifying of a load and its location within the premises. It is clearly advantageous to have simplified method to set the indexes without error including the providing of an automatic error detection, particularly at time of installation.

Yet another object of the present invention is to use the loader for processing the introduction of an RFID tag to the AC plug of a given appliance for use within the premises for identifying and indexing the appliance connection to an AC outlet or sub outlet at random for self-updating the home automation controller via the optical grid and/or the bus line of the automation system, whenever an appliance is connected or plugged into a given AC outlet or sub outlet.

The reference to home automation controller hereafter is to a panel with control keys or touch screen and/or remote control devices, or keypads and circuits similar to the video interphone and/or the shopping terminal disclosed in the US patents and the pending US applications referred to above.

BRIEF DESCRIPTION OF THE DRAWINGS

FIG. 2 is a block diagram of a loader similar to the loader of FIG. 1 with RFID reader for updating the propagated data with appliance particulars read from RFID tags;

FIGS. 3A~3F illustrate the loaders variations including touch screen types, touch screen combined with keys types and keys with small display type covering the types shown in FIG. 1 and FIG. 2;

FIG. 4 shows wave forms of the phase shifted AC current and the AC voltage and the timed measuring positions for calculating the actual power consumption;

FIG. 6A is an illustration of the loader of FIG. 1 as used for reading the particulars of an AC outlet;

FIG. 6B shows the displaying of the read particulars or data by the loader of FIG. 6A;

FIG. 6C is an illustration showing the extended details of the preparation for reading the particulars of a load and of an AC outlet by the loader of FIG. 2 via RFID tag and antennas;

FIG. 8A is an illustration of the installing steps of room and AC outlet addresses and the particulars of the load;

FIG. 8B shows the display of the install particulars;

FIG. 8C illustrates the optical cable grid for linking the power consumption data between AC devices and data receivers for power consumption or current drain and the set up for propagating optical data from the loader to the data receivers;

FIGS. 10A and 10B are tables showing appliance codes as used for RFID tags of the preferred embodiment of the present invention;

FIG. 11A is an illustration of RFID tags in a label form stuck onto ribbon base and sheets;

FIG. 11B is an illustration showing the installing codes into recordable RFID labels of the preferred embodiment;

FIG. 11C is an illustration showing the reading of codes from a sequentially coded RFID labels of the preferred embodiment; and FIG. 11D is an illustration showing the proximity for installing codes into recordable RFID labels and reading codes of a recorded RFID labels or tags by the loaders of the present invention.

DETAILED DESCRIPTION OF THE PREFERRED EMBODIMENT

Figure 1:
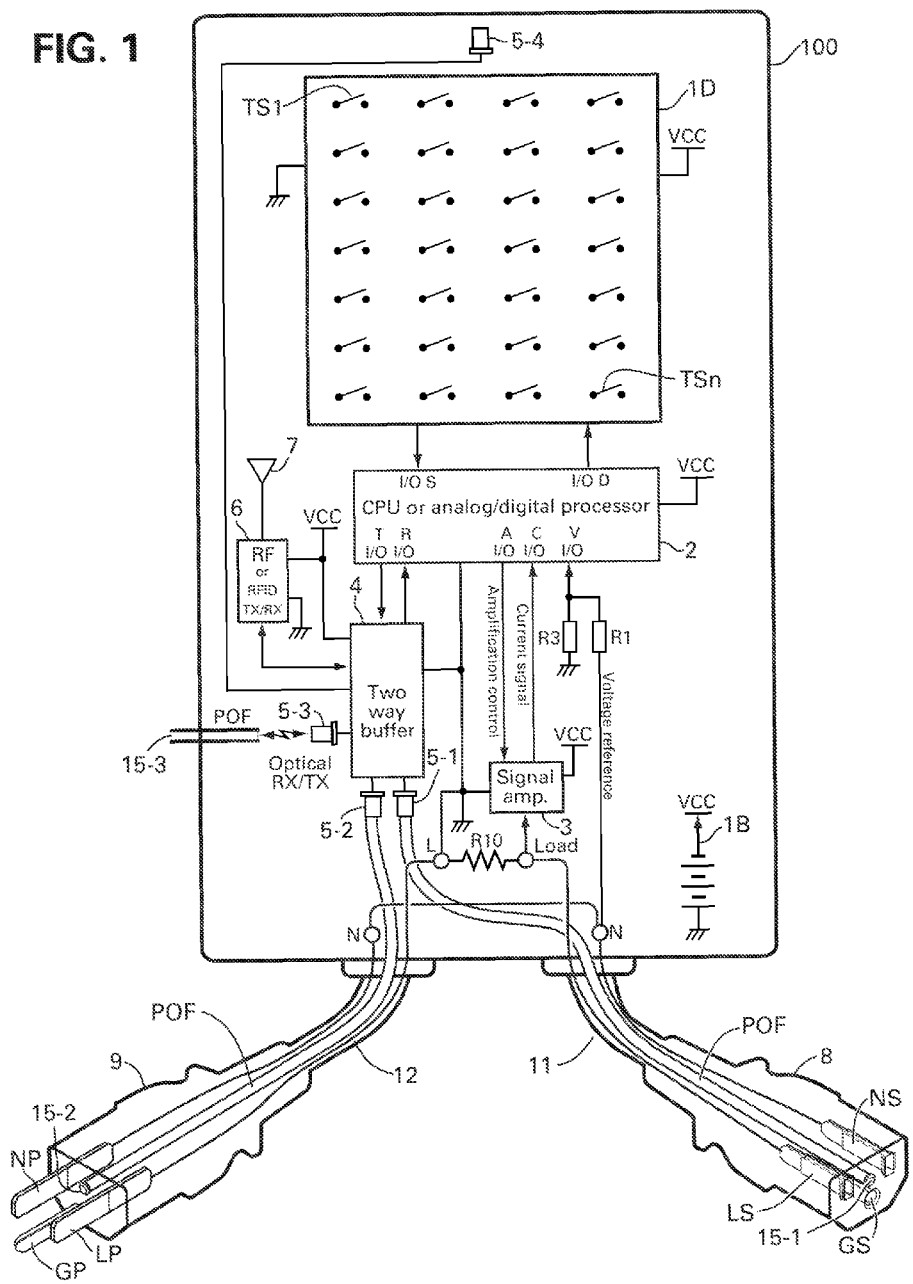
FIG. 1 is a block diagram of a loader for updating and calibrating the power consumption reporting via optical and RF signals of the preferred embodiment of the present invention.

Shown in FIG. 1 is a hand held tool 100 of the preferred embodiment for updating and calibrating the AC outlets, the AC sub outlets and other AC terminals feeding AC power to a randomly plugged AC power cables of an electrical appliances and/or of accessories of such appliances, such as power supplies or adaptors and/or fixedly attached appliances such as air conditioners and/or water boiler and/or heater and/or coolers or fans and the like.

Figure 5A:
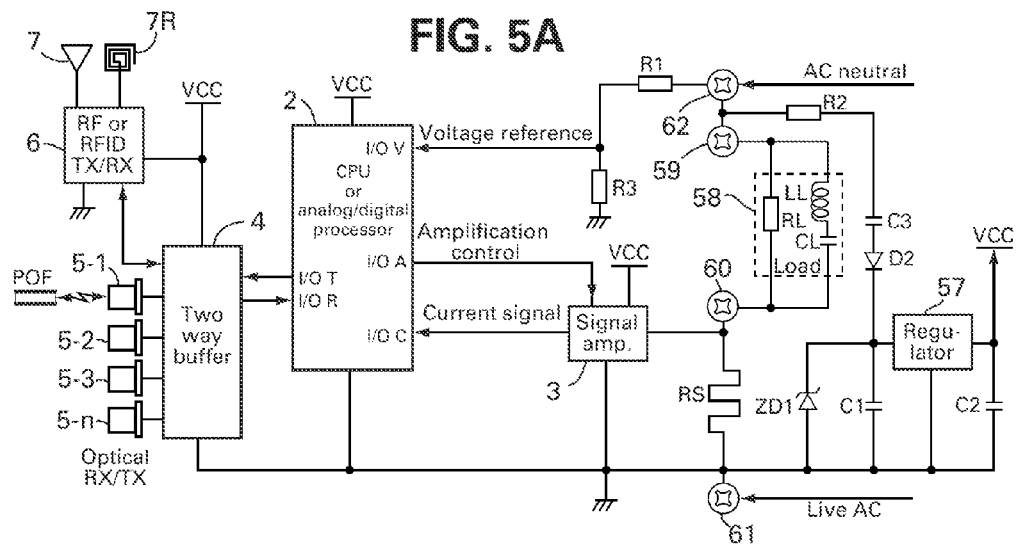
FIG. 5A is a block diagram of the current drain and power consumption reporting circuit including the optical and RF transceivers, comprising the circuits of the AC devices and outlets and similar to the circuits of the loaders shown in FIG. 1 and FIG. 2.
Figure 5B:
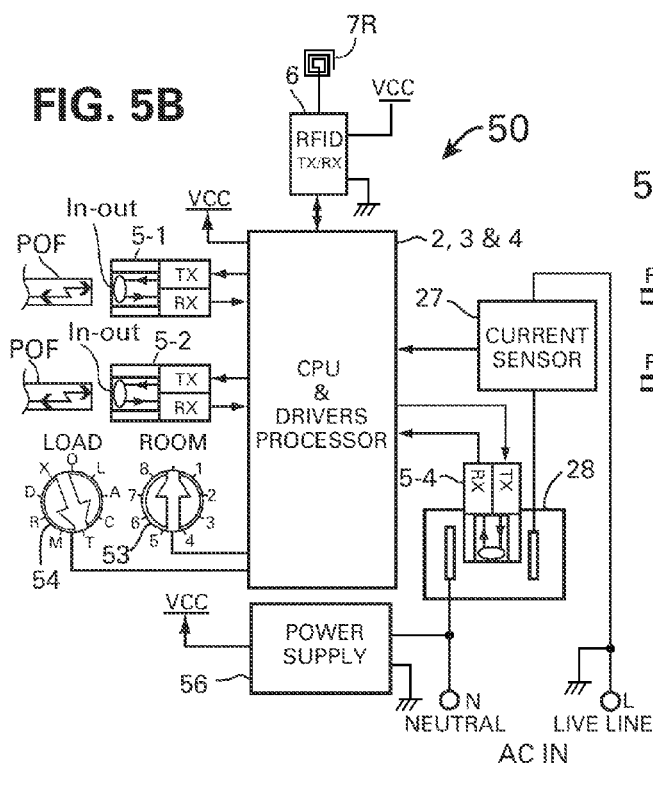
FIG. 5B is a version of the block diagram of FIG. 5A as used for AC outlet including setting switches.
Figure 5C:
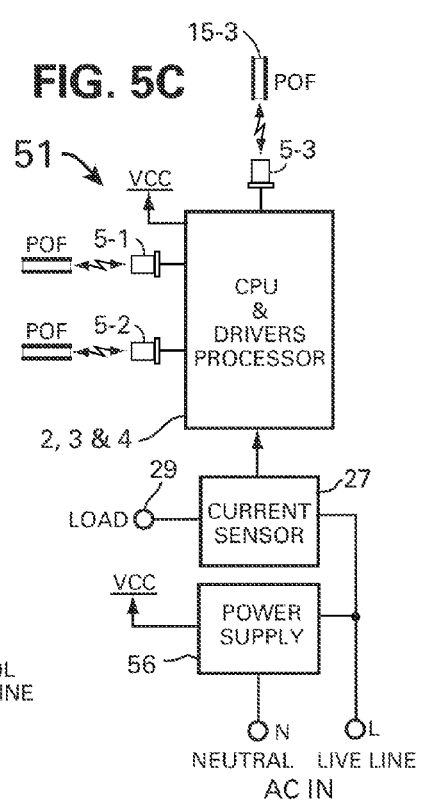
FIG. 5C is another version of the block diagram of FIG. 5A as used for AC terminal that is optically updated and calibrated by the loader of the present invention.

The hand held tool 100 termed a loader, adjuster or calibrator provide an important function, which is to measure and calibrate the reading of an intelligent AC outlet 50 and current sensor 51 shown in FIGS. 5B and 5C. The AC power consumption values differ from a DC power consumption. This is because of the shifting of the AC current phase versus the AC voltage phase, and the shifting depends on the capacitance or inductance values of the power consuming appliance.

A pure resistive load such as thermal wire heater does not shift the phase, but most of the appliances operate motors and are powered via switching power supplies which are both capacitive and inductive, such as the load 58 of FIG. 5A shifts the phases of the AC current versus the AC voltage and moreover, power supplies, particularly switching power supplies distort the shape of the sinusoidal curve of the AC power.

FIG. 5A shows a block diagram of the current sensor circuits including the power consumption reporting circuit and the communication circuits of the preferred embodiment of the present invention, using the low ohmic current sensing resistor RS. Similar circuits are disclosed in U.S. patent application Ser. No. 13/239,939.

The circuits including the CPU or analog/digital processor 2, the current signal amplifier 3 and the power supply regulator 57 are the basic circuits for the current sensing and processing including the measuring of the power consumed by a load 58 as used also for the AC outlet of FIG. 5B. The load is shown as an ohmic RL, an inductance LL and/or capacitance CL loads and combinations thereof.

The VCC power source in FIG. 5A is fed via the protection resistor R2, the capacitor C3 and the diode D2 to the input terminal of the DC regulator 57. The regulator 57 shown is the well known analog voltage regulator IC available by many IC manufacturers at very low cost. The shown regulator input circuit includes the filter capacitor C1 for providing low rippled DC input to the regulator and a zener diode ZD1 for protecting the regulator from voltage surges, commonly affecting the electrical systems. The output of the regulator includes a storage capacitor C2 for maintaining sufficient charge to power the current sensor circuits to complete the exchanging and/or the reporting of power status and/or the power consumed.

The live AC line is shown connected to the ground which is also the negative line of the VCC. The VCC shown is, for example, as a positive 3.3V, but can be 5V or 1.8V or any voltage commonly applied to a CPU and other ICs.

As the live AC is connected to the negative pole of the DC supply, the power feed into the input terminal of the voltage regulator 57 is connected to and fed from the neutral AC line to the rectifying diode D2 via the series capacitor C3, an AC grade capacitor, and depending on the power line voltages, may range from, 0.22 micro farad for the 230/240 VAC (EU, UK) and up to 0.22~0.33 micro farad for 100/120 VA (Japan/US) also considering the power frequency 50 Hz or 60 Hz respectively.

The VCC of the loader however is powered by alkaline or other known batteries 1B or by rechargeable batteries via a charging circuit or charging connector (not shown). The random use of the loader will not drain or discharge the batteries fast, and the batteries used to calibrate, upgrade and download outlet addresses will last long for the purpose of supporting the smooth accurate operation of the automation program.

The current sensing resistor RS or R10 shown in FIGS. 1 and 2 is a low ohmic resistor, such as 1 mOhm or 2 mOhm and will develop small signals such as micro or milli volt signal for current drain in the ranges of approximately 1 W~3 KW (8 mA~16 A).

The signal amplifier 3 is the well known linear amplifier or dual amplifiers IC, connected in series for amplifying the signal developed over the sensing resistor R10. The amplifier 3, combining two amplifiers also known as operational amp. or op. amp., with each amp is set to amplify by, for example, up to a factor of 100 and the two in the series can therefore provide up to 10,000 amplification factor. The linear amplifying of the signals generated by the 10 mA~16 A current drain will be well within the linear range of the amplifier 3.

The CPU (Central Processing Unit) or analog/digital processor 2 hereafter referred to as CPU includes analog to digital and digital to analog converter ports, digital ports and analog ports. The CPU 2 is a commonly available CPU, such as 8 bit or 16 bit low cost, low power consuming processor including a memory. The CPU operates on 1.8V or 3.3V, with an operating current such as less than 1 mA and a sleeping current of few micro Amperes.

The amplified current signal is fed from the amplifier 3 to the port I/OC and based on the amplification control status and the data pertaining to the converted analog current signal to digital, the CPU is programmed to adjust via the I/O A port the amplification factor of the amplifier 3 to obtain the optimum amplification as programmed, commensurate with the received signal to be in mid or most linear range of the resistor RS or R10 selected range.

As shown in FIG. 5A and referred to above, the load 58 is not a pure ohmic or a resistive load. It may be a motor and/or a capacitor and/or a switching power supply commonly used with electrical appliances including PCs. Non ohmic loads cause a phase shift between the voltage curve and the current curve and/or distort the curve by switching power supplies. FIG. 4 shows two sinusoidal curves, the voltage curve 80~86 and the current curve 90~96, which are shifted by a random angle, caused by an unknown combinations of the RL, LL, and CL load.

The voltage curve 90~96 is curve of a reference voltage fed to the I/OV of the CPU from the neutral AC terminal N via a large ohmic divider R1 and R3, with R1 value is in a range such as 0.5~1.0 Mohm and R3 value is few Kohm, to provide an optimum reference signal level representing the power line voltage, the 120V/60 Hz of the US or the 230V/50 Hz of the European power line. The current curve 90~96 is the amplified current signal and an accurate reference of the current drain value.

A zero crossing 80 of the reference voltage curve is the start position or point in time for the processing of power consumption reading. The current phase shift is evident from the deviation of the zero crossing of the current curve.

The zero crossing 80 shown is the cross from negative to positive, at that same time, the start position time 90, the current curve is shown to be close to the peak of the negative curve, or at a phase shift of more than 90°.

The processing shown in FIG. 4 is the measuring of the five reference cycles 81~85 and the phase shifted five current cycles 91~95. The measuring positions or points in time are shown in FIG. 4 as ten points spread over the voltage curve as 81-1, 82-1, 83-2, 84-3 and 85-4 for the voltage points of time, coincide with the exact point of times over the current curve shown as 92-4, 93-5, 94-6 and 95-8. The end of processing positions or point of times are shown as 86 and 96. The shown time interval is 2 mSec for 50 Hz and 16.6 mSec for 60 Hz. The vertical lines divide one cycle into ten points of time, therefore the interval between each point of time is the time duration of one cycle divided by 10.

The time interval or the number of measure points during one cycle (Hz) directly relates to the accuracy of the measurement, same applies to the number of measured AC cycles in one measuring round. Both are a decision to be made, in which higher accuracy require more measured AC cycles (Hz) in one measuring round and a decrease in time intervals or an increase in the number of measuring point.

The power consumption is the product of a calculated sinusoidal VxA graphs created on the basis of the measured values at each point of time simultaneously and summed up per each cycle on the basis of the voltage referenced timing. The shown five cycles 81~85 in FIG. 4 are an example of one round of measurement repeated, for example, every two seconds. When a calculation round is programmed to be carried every two seconds the total of five measured cycles will be multiplied by a factor of 20 for 50 Hz and 24 for 60 Hz (50:5/sec.×2 sec.) or (60:5/sec.×2 sec.). This will represent the power consumed in two seconds.

By the above it should be obvious that the power consumption calculation by the current sensors of the present invention can be simplified and performed by a low cost Central Processing Unit (CPU) or an analog/digital processor both are available from many IC manufacturers. It should be also obvious that the current sensor of the present invention can be made small in size, fit into AC outlets and into the hand loader or adjuster of the preferred embodiment of the present invention.

The calculated power consumed values are stored and updated in the memory included in the CPU for reporting as programmed to a controller. The calculated power consumption value is converted into a predefined programmed protocol that includes particulars of the load or appliance and the location of load and/or of the AC outlet. The stored and updated data in the memory are the coded protocols.

The referenced U.S. Pat. No. 8,170,722 teaches the coding of power consumption command protocols and the signal structure of the protocol reporting. The command structure is designed to be short command comprising five bytes only that include all the necessary data for reporting power consumption, the load particulars and its location.

The power consumption reporting AC outlet disclosed in the U.S. application Ser. No. 13/349,939 feeds the VCC supply to the sensor circuits only when a current is drained through a load. The short command is necessary particularly when the load is switched off or the plug is removed from the AC outlet. A short command is therefore needed to minimize the size of the storage capacitor C2 by reducing the time it takes to complete the status reporting when the VCC is cut, such as transmitting "the load is switched-off" protocol.

Short protocol is critical as the LED draws up to 5~6 mA from the storage capacitor C2 to transmit responses for responding to inquiry commands from a controller when no VCC is present. Longer protocol will require bigger capacitor with large physical size.

The DC current to the RF transmitter for generating output of several micro watt is small, however, here too it is preferable to minimize the length of the reporting protocols because of the RFID exchanges which are discussed later. The block diagram of FIG. 5A shows the RF transceiver 6 and optical transceivers 5-1 to 5-n, but in systems operating through optical network only the RF transceiver 6 is not needed and is not used. Regardless it is possible to include both the RF and the optical transceiver in the circuit for combining wireless communications including IR, RF, RFID and optical via optical cable network, all in parallel.

The two way buffer 4 is a well known amplifier-buffer, available in small surface mounted IC packages from many semiconductor manufacturers. Its purpose is to interface the signals and their levels and feed the two way signals between the transceivers 6 and 5-1~5-n to the CPU 2 I/O T (transmit) and I/O R (receive) ports.

The shown display 3D is an LCD with touch screen icons TS1~TSn. The touch screen icons are drawn as a contact of a switch to be touched and activated by a finger. The number of the touch screen icons is n and size, shape, color and content can be programmed into the display to identify the function of the icon. Several display pages can be formed, for different application, such as reading, measuring, comparing, loading, appliances pages, AC outlet pages and any other needed pages for entry, reading and processing data.

Shown in FIGS. 3C—3F are other display screens 2D and 3D, combined with push switches shown as K1~Kn. The switches and the touch screen icons are functionally operating the same way, and are individually identified for feeding a touch or push command to the CPU 2 via the I/O S (switch) port that responds identically to an activated touch icon or push switch. The display itself is responding to the touch icons and the push switches as programmed and fed from the CPU via the I/O D (display) port, shown in FIGS. 1 and 2.

For multi AC outlet sockets that are mounted inside electrical wall boxes, it is preferable to use one CPU for calculating and reporting the individual consumption via each single outlet socket. The circuit is not shown as the difference for such multi socket AC outlet will be additional optical transceivers or as explained later RFID transceiver. This including plurality of current sensors 27 each combining the current sensor RS and the signal amp. 3 will be substantially cheaper versus the cost of an individual circuit 50 as used for each AC outlet.

Same applies to the AC sub outlets of the well known extension cable assemblies such as using 3 or 6 sub outlets, as disclosed in U.S. patent application Ser. No. 13/599,275.

Depending on the selected CPU and the analog/digital processor 2 there are many such known devices that include I/O ports that require no additional buffer as they can be programmed to output and receive varying signals commensurate with the signal exchanged between the CPU and the transceivers. For such devices the two way buffer 4 is not needed and is not used.

U.S. Pat. No. 8,170,722 teaches the use of hand held loading devices for loading addresses, locations and appliances particulars. It also teaches the setting of the particulars via digital switches of a variety of AC devices, including plugged in-line current sensors adaptors 155 shown in FIG. 8A. The current sensor 27 and the circuits including the CPU, processor and driver 2, 3 & 4 of the power outlet of FIG. 5B and of the current sensor adaptor circuit of FIG. 5C are similar circuits using well known parts, packages and ICs in different combinations shown in FIGS. 5A, 5B and 5C.

The AC outlet of FIG. 5B is shown with setting switches 53 and 54 and an AC socket 28. The current sensor of FIG. 5C is shown without digital switches and with an AC terminal 29. The current sensor can combine identical digital switches as disclosed in the U.S. Pat. No. 8,170,722.

The loader including the light bulbs loading accessories shown in U.S. Pat. No. 8,170,722 are mechanical optical accessories for directing the optical signal while they feed power to the light bulbs during the loading of the addresses or the locations including the light bulb particulars.

The U.S. Pat. No. 8,170,722 teaches also another loading of addresses and particulars of the devices or the appliances, processed by the original remote control units, such as the original RF remote control supplied with an appliances such as a television. Such RF remote control can be used for introducing an address into the RF remote control signals, commensurate with the programmed premises automation.

Figure 7A:
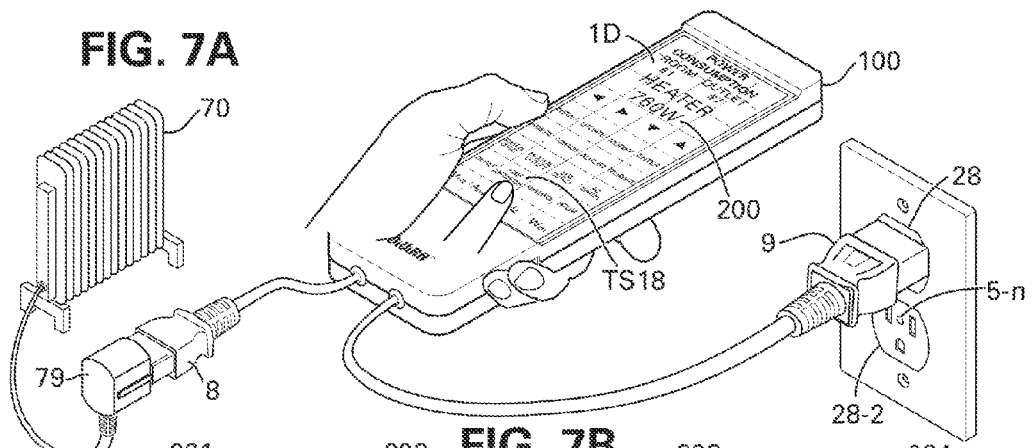
FIG. 7A is an illustration of a setup shown in FIG. 6A for measuring the power consumed by a load.
Figure 7B:
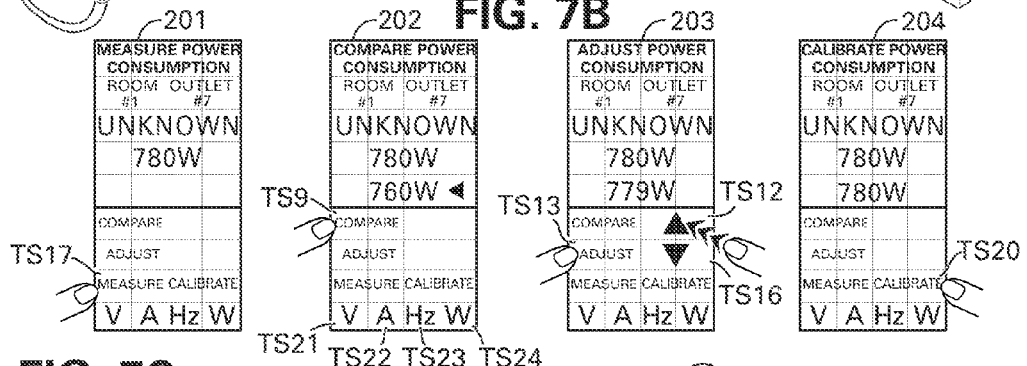
FIG. 7B shows the displays of the measured, compared, adjusted and calibrated power consumption of the preferred embodiment of the present inventions.
Figure 7C:
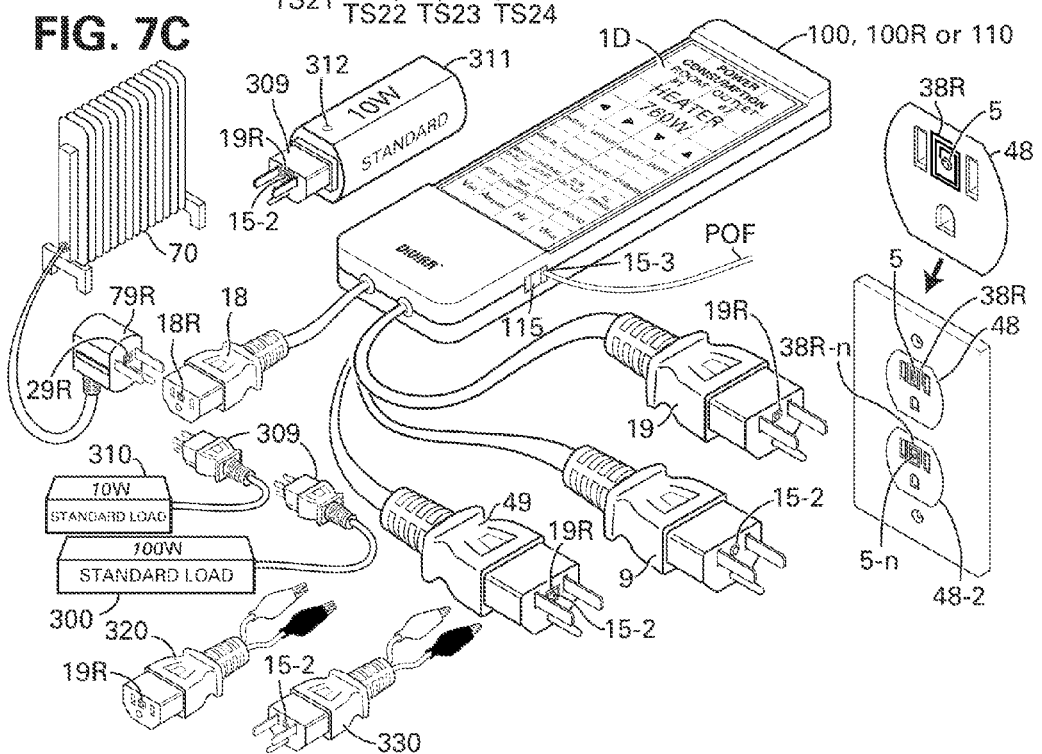
FIG. 7C is an illustrated exploded view of a combination loader of FIG. 1 and FIG. 2 including the elements of the optical ports, RFID tags and the measuring accessories of the combination loader of the preferred embodiment of the present invention.

In all the referenced US patents and applications however no adjustment or calibrations of power consumption reporting such as provided by the loader of the present invention are disclosed. FIGS. 7A~7C show the setup for processing the calibration of the power consumption reporting by the AC outlets, sub outlets and other AC terminals.

AC outlets and other AC devices disclosed in the referenced US patents and applications are connected in a cascaded chain via the optical cable for up to n AC devices, to an AC current drain receiver or to a command converter for converting the optical signals into electrical signals for propagating the power consumption reporting via the low voltage bus lines to the automation distributor and/or directly to the system controller.

The simplified cascaded connections enables to optically link the entire AC outlets, sub outlets and other AC devices and terminals into a power consumption reporting grid in which every load needs to be itemized and detailed.

The U.S. Pat. No. 8,170,722 details the reporting via five Bytes command protocol referred to above, on the basis of an identified appliances by setting each appliance particulars and its location via digital switches or via loading the particulars into a memory of the AC outlets and other AC devices via an optical link.

The loader 100 shown in FIG. 1 provides for such loading and updating the particulars of each AC outlet, sub outlet and other AC terminals feeding AC power through a current sensor. The identification of an AC outlet, is a two-step loading, first is the room or zone number, followed by an outlet number. The preferred embodiment in the U.S. Pat. No. 8,170,722 provide for 8 rooms plus one common zone and up to 16 AC outlets per each room or zone.

Shown in FIGS. 6A and 6B are the optical data reading processes, such as the AC outlet number and the room number. This is prior to installing a code of an appliance that is intended to be connected to the AC outlet of the present invention, such as recited in the referenced US patents.

The shown loader 100 is attached via its cable and plug 9 to the intended to be used AC outlet 28 with the heater 70. The loader 140 is to be connected via its cable and socket 8 to the plug 79 of the appliance (heater) 70. The optoport 15-2 of the AC plug 9 shown in FIG. 1 is directed to the optoport 5 (now shown) of the AC outlet 28 for communicating an install command protocols such as loading the AC outlet number, the room number and the appliance type code, which can be a given code or a number assign to each type of appliance shown in the appliance code table of FIG. 10.

Shown in FIG. 2 is a loader 110 that is similar to the loader 100 of FIG. 1 with the exception of the optoports 15-1 and 15-2 of the shown AC socket 18 and plug 19 that are replaced by an RFID antenna, such as coiled antenna 18R and 19R. Even though not shown in FIG. 2, the RFID antennas 18R and 19R can be used along with the optoports 15-1 and 15-2 and operate in parallel or selectively as selected via the touch screen icons TS1~TSn or via keys K1~Kn provided and shown in FIGS. 3B~3F.

As will be explained later, the loaders 110, 130 and 150 can load the room number, the AC socket number and the appliance code including the calibration of the power consumption reporting via RFID communication when the system is connected as shown in FIGS. 7A~7C. This will be referred to later.

The shown photo transceiver 5-4 of FIG. 1 enables the loading, updating and communication between the loader 100 and an AC outlet or other devices having an optoport in positions accessible to the optoport 5-4 in front of the loaders 100, 120 and 140 of FIGS. 3A, 3C and 3E. The communications between a loader and an AC device or AC outlet pertaining to current drain or power consumption however cannot be checked, nor verified by linking the optoports in air or via POF. To load, update, verify and/or calibrate the power consumption reporting, the AC power feed must be fed through the loader sockets 8 or 18 and the plugs 9, 19 or 49 as shown in FIGS. 7A and 7C.

To adjust or calibrate the power consumption values outputted by the AC outlets and other AC devices the load must drain the current through the AC outlet 28 or 38 or 48, or a socket or other AC terminals and through the loader. This enables the comparison of the measured power consumption in real time simultaneously by comparing the readings. The loaders types 100~150 are pre-calibrated by the manufacturer for providing reliably verified values, on the basis of which the loader is calibrating the measurement and the reading of the AC outlets, sub outlets and other AC devices.

As disclosed in the referenced US patents and applications the room or zone addresses and the numbering of the AC outlets are set via setting switches or via loading the addresses (rooms, socket and other AC devices numbers) into the memory of the CPU of the AC device, including optical loading directly via lightguide (POF).

The first step for optical loading via the loader of the preferred embodiment is to plug the cable 12 and plug 9 assembly into an AC outlet 28 shown in FIG. 6A and switch on the loader, be it by touching the touch screen 1D, or by pressing the on-off key, such as key K1 shown in FIGS. 3C, 3F, 6A and 8A. The switch-on will reset the loader and generate an inquiry command for identifying the room and/or the AC outlet socket numbers, propagated via the optoport 15-2.

The display 101 of FIG. 6B and 801 of FIG. 8A shows the reading of the response by the AC outlet 28 of FIGS. 6A and 8A when a room #1 and the AC outlet #7 are recorded. In 102 of FIG. 6B the reading shown are "none" recorded for the room/zone and #7 is recorded for the AC outlet. The reading in the display 103 of FIG. 6B shows a recorded room #1 but "none" recorded for an AC outlet. When both the room or zone number, such as 1~8 and 0 (common) and an AC outlet number such as 1~16 are not recorded, the reading 104 of FIG. 6B will display "none" and "none", or "no room and no AC outlet" are recorded.

The non-recorded items shown in FIG. 6B prompts the loading process by touching first *1 the install icon of the loader 100 or by pressing the keys K3 shown in FIG. 8A, followed by touching or pressing *2 for example the room key K17, and continue by scrolling up-down the 1~8 or "0" (common) icons or pressing a numeral key shown as KN1~KN0 in FIG. 8A to select *3 the room 4 number. Touching the "enter" icon or pressing *4 the enter key K6 will load the selected number #4 into the memory of the AC outlet 28 as the room number or a selected zero "0" for the common area.

Next to install is the AC outlet number. As referred to above an AC outlet may comprise a single AC socket or a plurality of sub sockets for which two type of addresses are provided via two icons or select keys, the single AC outlet key K13 for outlets comprising a single socket or K14 for AC outlet with multi sockets shown in FIG. 8A. Touching the multi sub outlets key K14 *5 or icon will automatically assign a sub number from 2 to n for each sub socket, with the first socket, termed main or master socket, is given no sub socket code.

The AC outlet number will be identified by a single or dual digits, selected for example from 1 to 16. The sub outlets are identified by a code such as a1 to a6, with the entire address code for the sub outlet is for example 7a3 and display the sub socket to read 7-3, wherein the 7 is the number of the main socket of the AC outlet 7 and the -3 represents the sub socket 3 of the AC outlet 7.

To keep the address short it is preferable to use only single digit for an AC outlet comprising plurality of sockets.

Pressing the multi outlet key K14 *5 or icon, followed by pressing a number 8 key *6 selected from, as an example 1~8, followed by pressing the enter key K6 *7 completes the address or code setting for an AC outlet.

The keys of the loader shown in FIG. 8A may not include numeral keys shown in FIG. 8A as KN1~KN0, instead a number for the room or the AC outlet addresses select are displayed on the LCD screen and is scrolled via the up-down keys K2 and K10 for selecting the number, followed by the touching of the enter key K6 to complete the loading.

For an AC outlet with a single socket or an AC terminal that is connected fixedly via the current sensor 51 of FIG. 5C to an appliance, such as a water boiler, it is necessary to install the appliance type or particulars via the loader.

Touching the appliance key K18 *8 will recall an appliance or appliance page onto the LCD screen 1D, 2D or 3D shown in FIGS. 3A~3F for selection via the up-down icons or keys K2 *9 and K10 to scroll the list, or the left-right keys K5 and K7 to skip pages and/or combination of left-right and up-down keys to fast find the water boiler, followed by the pressing of the enter key K6 *10. This will record the appliance or particulars thereof into the memory of a given AC outlet 28 or into the memory of the current sensor 51 of the AC terminal 29 of FIG. 5C.

Unlike the fixed numbering, addresses or codes assigned to the AC switches, AC outlets and their sub outlets or sockets, assigned on the basis of their physical location within the premises, same cannot be applied to the loads or the appliances being powered through the AC outlets or sub outlets. The nature of the relations established between an AC plug being attached or plugged into an AC socket is anticipated to be a random relation or random connection, particularly into an AC outlet with multi sockets.

The optical signal solutions for identifying loads disclosed in the US patents and applications provide an optical signal identification via the AC plug of an appliance. For existing appliances with no optical signal identification, or for newly manufactured electrical appliances without optical signal identification, a current sensing adaptor with optoport, such as shown in FIG. 5A of U.S. Pat. No. 8,170,722, including the optical AC current receiver are used.

As optical grid or network is needed for propagating optical signals pertaining to the current drain and the power consumed by electrical appliances from the AC outlets or the current sensing adaptors, it is cheaper and simpler to introduce the optically linked AC outlets and link them via an optical cable to a current drain or power consumption data receiver regardless of the means for identifying the appliance or the appliance particulars.

The receiver 400 shown in FIG. 8C for receiving and converting the consumed power data into electrical signals fed via a low voltage bus-line 420 to the system controller, such as the video interphone, shopping terminal or a dedicated controller are disclosed in the referenced US patents and applications, can also feed or receive data via IR in air or RF signal through an IR or RF gateways.

As explained briefly above, the installing of optical data pertaining to an appliance type or appliance particulars by a loader, similar to the loader disclosed in the U.S. Pat. No. 8,170,722 is simple and effective for introduction of fixedly connected appliances, such as refrigerator, washing machine, dryer and television that are continuously connected to the same AC outlet.

Randomly connected appliances, however, such as hair dryer or steam iron or a food processor that is plugged into different AC outlet is troublesome. If the user desires to maintain a reliable power consumption reporting he has to repeatedly load the given appliance code when it is plugged at random to an AC outlet.

Users tend to avoid repeated routine loading or introductions in the course of their daily doings, particularly when such loading do not affect the anticipated appliance operation and performance. For this reason it is preferable to provide an "automatic" update, such as using RFID tag in a form of a small sticker or label 29R attached to the plug 79 outer surface between the plug's pins, shown in FIG. 6C.

The well known RFID tag or label requires no direct power connection as it is powered via its antenna, which in practice is a printed antenna. The RFID circuit is an IC package having sizes measured less than 1 mm$^2$ and is paper thin, such that it is assembled onto a self-stick label, in sizes that can fit the AC plug surface in the vicinity of the plug's pins.

The use of RFID for identifying AC appliances and other objects via their plugs are well known and disclosed for example in the US patents by Pourchot U.S. Pat. No. 7,167,078 and by Black U.S. Pat. No. 5,910,776 that teach how to switch on the power when the RFID codes of the tag and the reader match, or how to identify the location of the appliance by the identified plug including RFID tag.

The identification of the room or zone and the AC outlet disclosed in the referenced US patents and above, whereby the identification of the appliance location is based upon the recorded room and AC outlet numbers or codes, or via setting switches 53 and 54 of FIG. 5B, but not via the AC plug's RFID tag. The use of RFID tag of the present invention is for identifying the load or the appliance, for enabling a routine power consumption reporting to be complete, by including the particulars of a randomly plugged load or appliance into an AC socket.

Low cost RFID tag is simpler to use when it is provided with a fixed coded data, made shortest possible (in time) to minimize the drain of the stored power fed via the antenna. The length of the RFID code is directly related to the transmission frequency. Lower frequency band such as the 125 KHz of the preferred embodiment of the present invention, limits the length of the code substantially, as compared with the HF band of 13.56 MHz, or the UHF band of 800~900 MHz and/or the Bluetooth band of 2.45 GHz.

Another important aspect of the RFID is the applicable distance between the RFID tag and the RFID reader. The attempts to use RFID for communicating the location and other particulars of an operating appliance mandated propagation into an extended distances of 5 m or longer using the HF 13.56 MHz band or the UHF bands of 800~900 MHz and 2.5 GHz. Such higher frequencies enable the transmission of an extended data and protocols within the short times, measured in nano/micro second units, to the RFID readers, which propagate the read particulars through a wired or wireless network to a controller.

The use of 13.56 MHz or the UHF bands for communicating data between AC outlets, AC sockets or AC terminals in close proximity require substantial programming and shielding to prevent duplications, collisions and other difficulties with stray signals received by a plurality of RFID antennas such as in multi AC sockets of an AC outlet and others. Since RFID tags provide very limited programming or handling, the preferable use of RFID tags in home automation communication environment of the present invention is identifying of a load, which is achieved by a simple, short coded protocol.

The RFID circuit of the loaders 110, 130 or 150 however can communicate with the RFID reader of the AC outlet. The RF and RFID circuit of the loaders 100 and 110 is a reader circuit similar to the RF and/or RFID circuit 6 of the AC outlets of FIGS. 5A and 5B. This enables the use of loaders 110, 130 and 150 to install addresses such as the room or zone and AC outlets numbers, including the reading of the current drain or power consumption reporting, compare the power consumption readings and calibrate, via two way RF and/or RFID communications between the loader and the AC outlet, similar to the optical signal communications referred to above.

For verifying the power consumption by a load as measured by an AC outlet referred to above, the load or the appliance must be powered via the loader 100, 120 or 140 and the AC outlet, as shown in FIG. 7A.

Figure 9A:
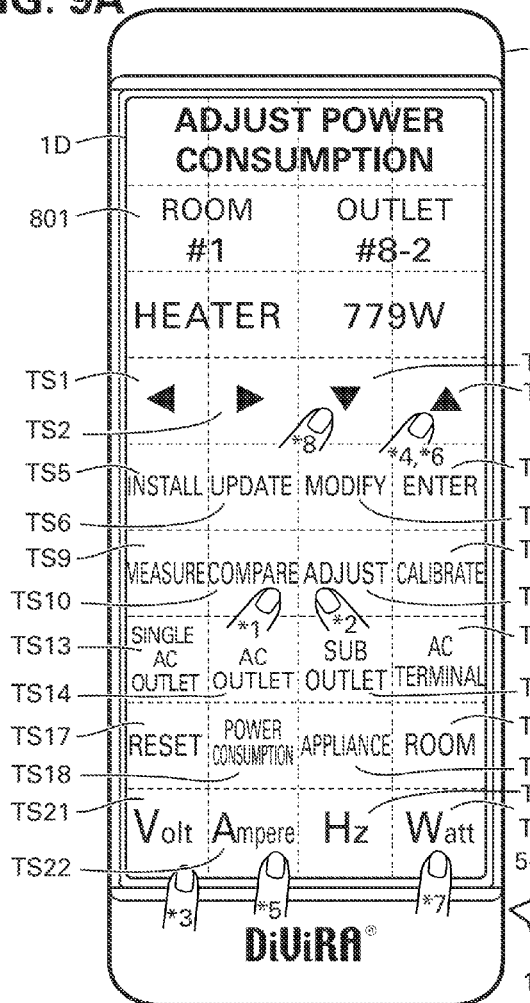
FIG. 9A is an illustration of the steps of adjusting the measured voltage, current and power consumption by a combination loader of the preferred embodiment of the present invention.

The load 70 shown in FIGS. 7A and 9A is a space heater connected via its AC plug 79 to the AC socket 8 of the loader and the loader AC plug 9 is plugged into the main socket of a multi AC outlet 28. The main socket 28 and its optoport 5 are covered by the plug 9 and are not shown, but the optoport 15-2 of the AC plug 9 is optically linked with the optoport 5 of the main socket of the AC outlet 28.

The AC plug 79 of the space heater 70, shown also in FIG. 6A is not provided with optoport or any other means, such as RFID tag, for identifying the load. Switching on the connected space heater, being the load for the drained current, will activate both the AC outlet 28 and the loader circuits, each to measure on its own the drained current and each calculates the power consumption independently.

The LCD screens 1D, 2D or 3D can all display the electrical parameters involved, the AC voltage, the AC frequency, the AC current drained and the consumed power, if so desired. For simplicity, particularly for non-technical savvy users, it may be better to display only the consumed power, as measured by the AC outlet 28, such as the 760 W shown in the display 200 of FIG. 7A.

Touching the measure icon TS17 of FIG. 7B or key K16 of FIG. 8A recalls the displaying of the power consumption as measured by the loader and shown as 780 W in the display 201 of FIG. 7B.

Touching the compare icon TS9 or key K20 as shown in the display 202 of FIG. 7B will display the two readings 780 W by the loader and the 760 W by the AC outlet 28. Touching the calibrate icon TS20 or the key K28 to calibrate the AC outlet will generate at least one command for modifying the parameters of the program of the CPU 4 used for calculating the power consumption.

Technical savvy users may want to know the reading and compare the voltages and the current drain by both the AC outlet and the loader. Touching the V, A, Hz or W icon TS21~TS24 and the measure icon TS17 will display the voltage, the current and the frequency as measured and touching the compare icon TS1 will recall and display the measurements by the AC outlet and the loader for comparison (not shown).

It is also possible to adjust the voltage, the current and the power as measured by the AC outlet by touching an icon Vadj. Aadj. or Wadj. (not shown) followed by touching the up-down icons for generating commands in steps, as shown in the display 203, to modify the program parameters including the amplification control and the voltage reference, shown via the I/O A and the I/O V in FIGS. 1, 2 and 5A, by small steps until the reading of all, the voltage, the current and the power as read by the AC outlet match the reading by the loader or adjuster 100, 120 and 140.

The references above to touch icons TS1~TSn and keys K1~Kn refers to any of the loader models shown in FIGS. 3A~3F. The model 100 is shown with touch screen 1D and with touch icons TS1~TSn only. The model 120 is shown with touch screen 2D and icons TS1~TSn and with keys K1~Kn. The model 140 is shown with keys K1~Kn and a display but no touch icons TS1~TSn. Same apply to the models 110, 130 and 150.

The models 120 and 130 use display screen 2D that is also a touch screen with touch icons TS1~TSn and push keys K1~Kn that can be partially assigned to same functions of the touch icons TS1~TSn, or both the keys and the icons area assigned with individual functions divided between the touch screen icons TS1~TSn and the keys K1~Kn.

The models 140 and 150 of FIGS. 3E and 3F include a small display 3D and are operated by the push keys K1~Kn only, even though the small screen shown as 3D can be provided with touch screen functions as well.

Each of the keys K1~Kn of FIG. 8A are shown with a given function, but the functions can be more than a single function. For example the shown power key K9 for measuring the power consumption can be named V-A-W for providing the individual measuring of Volt, Current (Ampere) and power (Watt) sequentially, with the screen changes its display from Volt to Ampere to Watt for each pressing of A-V-W key.

Some of the key functions shown in FIGS. 6A~9A are not discussed above, but are well known and need not be explained in details. Other shown keys such as reset key and not shown back (return) key or erase key, including remote functions keys for operating appliances and electrical circuit are also not shown, but can be introduced if needed.

The numeric entry select keys 1~10 are shown but given no identifying numerals or characters such as K-1 to K-0 to avoid confusion, instead the keys are shown in FIG. 8A as KN1~KN0 and moreover as referred to above, the numeric keys 1~10 may not be used altogether, for the limited anticipated use it is simple to scroll up-down the numbers displayed on the LCD screen via the up-down keys or icons, thereby cutting the keys and simplifying the operation.

Same applies to the touch screen icons TS1~TSn. The touch screen can be programmed for variety of functions and displays for loading appliance codes by scrolling lists and shifting pages, for evaluating errors in entries of socket numbers or codes. Review entry duplications by recalling data from the system controller or the system distributor, disclosed in the referenced US patent and application, via the optical grid and through the optoport 5 of any AC outlet or through an optoport of other AC devices, or as will be explained below via the RFID antenna 7R of FIG. 2.

Shown in FIG. 2 is a block diagram of a loader or a calibrator 110, 130 or 150 that are also shown in FIGS. 3B, 3D and 3F.

Each of the three loaders type differs from the others by the size of its display 1D, 2D or 3D and/or the use of push keys K1~Kn and touch icons TS1~TSn, similar to the referred to above loaders 100, 120 and 140. The differences between the three loaders 100, 120 and 140 group and the 110, 130 and 150 group are the introduction of RFID reader 6 with antenna 7R.

The models 110, 130 and 150 are shown to replace the optoports 15-1 and 15-2 with RFID antennas. But as shown in FIG. 7C the AC outlet 38 and socket 38-2 include both, the optoports 5 and 5-n, and the RFID antenna 38R and 38R-2. The shown plug 49 of the loader 100, 100R and 110 provides optoport 15-2 and the RFID antenna 19R. The other shown plug 9 provides optoport 15-2 only and the plug 19 is shown providing an RFID antenna 19R only, making it obvious and clear that the optical optoport and the RFID antenna can each be introduced individually into the AC plugs 9, 19 or 19R to communicate with the AC outlet optical signal only, RF signal only or both optical and RF signal.

FIG. 8A shows the display 800 of the loader 140 after it was plugged via its cable 12 and plug 9 into the AC outlet 28 shown in FIG. 6A and before the AC socket 28 was installed with the room number #4 and outlet number #8 referred to above and shown in FIG. 8B, including the introduction of the appliance shown to be a water boiler 500 of FIG. 8C. The AC socket 28 and/or the terminal 29 of the current sensor 51 shown in FIG. 5C are shown connected via their optical cable to a current drain or power consumption receiver 400 disclosed in the US referenced patents and applications, and shown in FIG. 8C.

The shown POF cable 15-3 is attached via a self-lock/release knob 115 to an optical access 5-3 of the loader 100R and to an optical access 45-5 of the receiver 400. The back of the receiver 402 shows eight optical accesses or optoports for eight POF cables, but n optical accesses or optoports 45-n can be provided and shown in 402. The front of the receiver 402 shows only four optoports 45-1~45-4, but here too 45-n optical two way accesses or optoports can be introduced.

As disclosed in the referenced patent and applications the receiver 400 is connected via a non-polar 2 wire bus-line 420 that also feeds the receiver with a low DC voltage needed to power the receiver operation and communication. The receiver 400 communicates two way with the system controller directly, or via a system distributor. By this the loader is programmed to communicate with the system controller, all addresses and appliances particular, including current consumption records and past data via any of the optoports of the system.

The optoports in the front 401 of the receiver are intended for connecting POF cables for receiving data from current sensing adaptors 155 referred to above, but can communicate with AC outlets as well and are easily accessible to the loader for communications with the controller. The shown setting rotary switches 53 and 54 are provided for setting room number and particulars of the outlets and/or current drain adaptors 155 connected to the receiver 400.

The shown loaders 100~150 can install the room addresses and of the current sensing adaptors and/or of the AC outlet via their front mounted RFID antenna 7R or optoport 5-4 or via the POF cable connected to the optoport 5-3 of the loader, by loading the addresses to the corresponding optoport 45 of the receiver 400, in which case the setting switches 53 and 54 are not needed and are not used.

FIG. 9A shows a connection setup similar to the setup shown in FIG. 7A with the exception of the heater plug 79R and the loader socket 48. The heater plug 79 is shown in FIG. 7A to be without optoport or the RFID tag 29R, while an RFID tag 29R is attached to the surface of the plug 79R of FIG. 9A for identifying the load to be a space heater.

The socket 18 or 48 of the loader 100R comprising an RFID antenna 18R for communicating RFID signal and codes with the plug 79R. The socket 48 further comprising an optoport 15-1, corresponding to the plug 49 shown in FIG. 7C for communicating both optical and/or RFID signals.

The loader 100R shown in FIG. 9A is an expanded loader 100 of FIG. 1 to include also RFID RX/TX circuits 17 in both the plug 19R and the socket 18R by using a buffer IC 4 and/or a CPU 2 with extended two way ports, for all the optical transceivers 5, the RFID transceivers 17 and the RF or RFID transceiver 6. The model 100R with the RFID antenna included in the socket 48 and plug 49 shown in FIG. 9A is therefore a combination loader covering both RFID and optical identification of a load and for communicating with AC devices via optical signals and/or RFID signals.

As referred to above, the screens 1D, 2D or 3D display different icons and are reorganized to display simplified content for operating a given function or tasks.

The loaders can be supplied with accessories such as the accessories 300~330 shown in FIG. 7C to include standard resistive load 300 for calibrating the loader itself to 100 W, several types are needed for the different AC voltages such as 120V (US), 230V (Europe), 240V (UK and Australia) or 100V (Japan).

A smaller standard load 310 for 10 W calibration, a socket 320 and a plug 330 with crocodile clips for measuring AC voltages, AC current, frequency (50 Hz or 60 Hz) and power consumption. The clips are needed when the plug 9, 19 or 49 and/or the socket 8, 18 or 48 cannot be plugged to the AC electrical circuit and need such crocodile clips for measurements by attachment to terminals.

The standard loads 300 and 310 for calibrating the power consumption reading, by the loader itself and by the AC socket via the loader, are further provided with a self-calibrating version. The self-calibrating loads use simplified circuit versus the circuit shown in FIG. 1 or 2, requiring no touch screen or keys, a single optoport 15, a single RFID circuit with antenna 7R, or both and a limited program for loading a command to calibrate the power consumption reading, for example 10W.

Such small circuit can be powered via a small series resistor connected in line with the standard load. The voltage drop developed over the series resistor provides the very small mW power needed to operate the circuit. This also provides the auto switch on, resetting the CPU and communicating the calibration commands to the AC outlet by the plugging action, or by engaging or mating the plug 309 with the AC socket.

The simplified circuit is made small enough to fit into the plug 309 shown in FIG. 7C. Moreover, calibrating power consumption by small resistive loads such as 10 W or 20 W generates manageable heat. The lower heat can be sustained by the shown plug-in loader calibrator 311, which is a plug-in calibrator, including a dual color LED indicator 312 for confirming when the calibration is completed, or that the calibration has failed, upon plugging the calibrator 312 into the AC outlet or socket.

Similar variations or combination circuits and programs are introduced into the socket 320 and plug 330, shown in FIG. 7C with optoport 15-2 and RFID antenna 19R or with a combined optoport and RFID antenna as shown in plug 49 or the socket 48 of FIG. 9A.

Such optically and/or RFID communicating socket and plug are very helpful to electricians setting up and calibrating an electrical system via the loaders of the present invention, particularly when the system is controlled by optical network including the monitoring of the premises automation and for calibrating the values of the power consumed by fixedly installed appliances, some of which are identified via RFID tag attached to their plug.

The ability to calibrate the AC outlets and sockets by a simple plug in action, does not require two way communications and a simple loader can be made cheaper if the coded commands are transmitted one way by an LED transmitter or RFID tag, generating just a command to calibrate the AC outlet to the same value as measured by the loader. If the AC outlet is correctly calibrated the CPU of the AC outlet will ignore the identical command received. Such calibrators will be of a lower cost and enlarge the range of calibrator-loaders of the present invention.

The display 801 of FIG. 9A shows the power consumed values to be 779 W as adjusted in small steps in the display 203 of FIG. 7B. The consumption value was not fully adjusted, because the reading by the loader shows 780 W and the reading by the AC outlet is 779 W. The comparison measurement does not concern the propagated signal by the plug 79R of the appliance and therefore no RFID select icon, such as K11 of FIG. 8A is shown in FIG. 9A for reading the appliance code.

The function of the loader 100R of FIG. 9A as selected by step *1, touching the compare icon TS10, followed by step *2, touching the adjust icon TS11 is for calibrating the AC outlet power consumption readings in steps. Generally no communications are anticipated via RFID or optical signal with the AC plug of the load, because the adjustment does not concern the type of the appliance. However, the shown combination loader model 100R does not need select icons for RFID or optical signal when communicating with the AC plug, as the loader 100R is provided with auto signal select function.

Figure 9B:
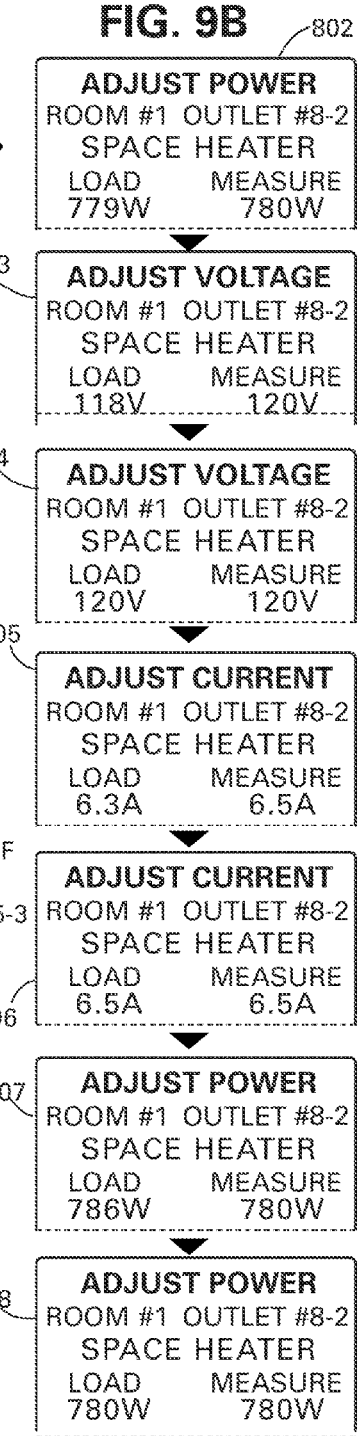
FIG. 9B shows the displays of the adjustment steps of FIG. 9A.

The imperfect calibration in steps of the power consumption value shown in the display 203 of FIG. 7B and repeated in the display 801 of FIG. 9A suggest that the other measuring programmed parameters, such as the voltage reference value and/or the current values may need to be adjusted individually. FIG. 9B shows the adjustment by steps of the voltage, the current and the power consumption reading by the AC outlet 48-2.

The displays 802~808 of FIG. 9B show the adjustment made to voltage, current and power consumption reading, using the icons program of FIG. 9A. The loader 100R of FIG. 9A includes auto signal select function, activated by the touching of the compare and adjust icons to read that the appliance is a space heater 70 via the RFID code generated by the RFID tag 29R shown in FIG. 6C. The appliance type is displayed in 802 of FIG. 9B. The appliance code is communicated to the socket 48-2 by an optical signal via the optoports 15-2 of the plug 9 or 49, and 5-n of the AC socket 48-2, both 5-n and 48-2 are covered and not seen in FIG. 9A but are shown in FIGS. 7A and 7C as 5-n and 28-2.

The adjust power display 802 shows the appliance to be a space heater and the shown power measured values 779 W versus 780 W are the values shown in the display 203 of FIG. 7B. As referred to above, the inability to calibrate the power reading through the power consumption calculation program parameters and algorithm, clearly identifies the need to adjust the voltage reading, the current reading or both.

Step *3, the touching of the Volt icon TS21 recalls the adjust voltage display 803, showing an error reading of 118V by the AC outlet 48 versus the 120V reading by the loader. Step *4 is a repeated touching of the up icon TS4 until the voltage reading is adjusted to the 120V shown in the display 804.

Next step *5 is the touching of the Ampere icon TS22, that recalls the adjust current display 805, displaying a low current reading of 6.3 A versus the current reading of 6.5 A by the loader. Step *6 is repeated touching of the up key TS4 until the current reading is adjusted to 6.5 A shown in the display 806. Step *7 is the touching of the Watt icon TS24 to recall the adjust power display 807 showing over reading of the power consumption, 786 W versus the 780 W by the loader. Step *8 is a repeated touching of the down icon TS3 until the power reads 780 W to complete the adjustment processes.

RFID tags such as the RFID label 29R referred to above are low cost tags that are supplied, similar to a well known thin self-stuck labels, lined up, onto a ribbon roll or onto sheets 190~195. RFID tags or labels are available in different forms. The preferred label is printed with given identification onto each label and each is pre-installed with a pre-programmed code, such as listed in tables 700 and 701 of FIGS. 10A and 10B. The printed/coded RFID tags or labels 29R of the preferred embodiment shown in pages 190 and ribbon 191 are shown in FIG. 11A.

The non-usable RFID tag is a blank label installed with identical code for all the labels of the ribbon or the page or group, such labels are not shown, because identical labels cannot be used with the present loader or the AC plugs.

Other blank and non-programmed RFID tags or labels 129 of pages 192 and ribbon 193 can be individually installed with a given appliance code of FIGS. 10A and 10B. The labels 129 are shown being programmed or installed by the loader 100, 130 or 150 via its RFID antenna 7R in FIGS. 11B and 11D. The blank labels 129 can be marked by a soft marker 199 as shown in FIG. 11B after they are programmed by the loader.

Numbered RFID tags or labels 139 are pre-installed with sequencing codes or numbers that cannot be changed or re-installed are shown on sheets 194 and ribbon 195 of FIG. 11C. The loader models with RFID reader can read the codes as shown in FIGS. 11C and 11D and install the read code into the AC outlet affixed with a given appliance code at the time of attaching the RFID tag or label 139 to the plug of the given appliance, similar to the loading of the tag 29R shown in FIG. 6C.

The size and shape of all the different RFID tags or label forms can be the same, or can be printed/manufactured to fit the different AC plugs, be it US, Europe, China or other standard power plug of a given country. Same apply to the loader models 100~150 and the combination models 100R, 120R and 140R, they are provided with corresponding plugs 9, 19 or 49 and sockets 8, 18 and 38, to commensurate with the country were they are distributed.

All the loader models with RFID reader can communicate with any of the usable type of RFID tags. The RFID loaders can download an appliance code, shown in the tables 700 and 701 of FIGS. 10A and 10B, to the RFID tags that are blank and recordable, shown in FIG. 11B. The RFID loader models decode the code of the sequential codes or numbers of FIG. 11A and affix to the code an identifying code of an appliance, listed in tables 700 and 701.

The program of the CPU 2 of the AC outlet 28 includes a conversion program for converting an identified RFID code that are affixed to or appended to be a code for identifying a given appliance such as a television or a food processor or a shaver, having a sequentially coded RFID tag, attached to its AC or DC plug. The RFID tag can be attached to a DC plug that is connecting or mating the appliance to a power adaptor including an RFID reader or optoport.

Simplifying the identification of the appliance, the AC outlet to which the appliance is connected and the room or the location of the appliance is achieved by providing three small memory files. The first file is the room file used for recording and storing a maximum of two digits for each stored room number.

The second file is the AC outlet, sockets and sub outlets address, this file too is a small file for recording up to a maximum of two hexadecimal digits for covering 255 outlets, that fit practically any residence size, or a maximum of four hexadecimal digits for covering AC outlets of very large offices or other businesses, including hotels with thousands of rooms.

The appliance code tables of FIGS. 10A and 10B clearly show that a single Byte or 8 bits can well cover the entire conceivable present days appliances. This means that the loading into a memory file a maximum of 255 codes is sufficient to identify all the practical appliances in the many rooms of a residence or office for the purpose of measuring and reporting the current drain or the power consumed by each appliance, including the control of the appliances.

The smallest standard RFID tags and labels are coded with 32 bits, but can be supplied with 16 bit codes. Such prefabricated and imprinted RFID labels with each tag is imprinted with the type of appliance and coded with the codes of the tables 700 and 701 are very low cost RFID tags. The fixed serially or uniquely numbered codes are annexed to the appliance code stored in the appliance file of the memory of the CPU 2 of the AC outlet 28, 38 or 48.

The decoded codes of the serially or uniquely numbered RFID codes can be further propagated via the optical network of POF cables linking all the AC outlets of the system to the system controller and/or the system distributor, disclosed in the US patent and application referred to above.

The optical network provide for uploading or updating the entire system with the unique or the sequential codes for enabling any and all of the AC outlets and sub outlets or sockets to identify the randomly plugged appliances regardless of the AC outlet they use. Providing the automation with the needed identity of random appliances plugged into any of the AC outlets.

It becomes obviously clear that the loaders with RFID reader combined with the optical signal communications provide the means to introduce a simplified RFID tags for self-identification of appliances that are randomly plugged or mated with the AC outlets, sub outlets and sockets, by simply plugging the plug to an AC socket 28, 38 or 48 or to a socket of an extended power cable with multi AC sockets, disclosed in the referenced US patents and application.

It also become obviously clear that the use of the loader or calibrator of the present invention to install particular of appliances, AC outlets and locations, measure and calibrate for reporting the precise power consumed by a given premises, with the detailed precision that is needed for such undertaking, is achieved with simplicity and at a low cost.

It should be understood, of course, that the foregoing disclosure relates to only a preferred embodiment of the invention and that it is intended to cover all changes and modifications of the example of the invention herein chosen for the purpose of the disclosure, which modifications do not constitute departures from the spirit and scope of the invention.

What is claimed is:

1. An intelligent Ac outlet comprising a CPU, a memory, at least one rear optoport, one of read and read/write radio frequency identification (RFID), antenna and a current sensor, forming together a measuring and communication circuits for at least one of communicating coded RFID signal with one of an RFID antenna and a tag affixed to an AC plug of a given load for identifying said load;

said rear optoport is communicating via an optical cable selected from a group comprising lightguide, fiber optic cable and a combination thereof with a second optoport of one of a current drain and a power consumption receiver propagating at least one way of bidirectional coded optical signal pertaining to a power consumed by said load as measured by said measuring circuit and at least one of particulars of said AC outlet and the identification of said load;

said particulars of said AC outlet are set by one of loading location codes to said memory and manual setting via setting selector included in one of said AC outlet and said one of current drain and power consumption receiver;

said RFID tag is affixed onto the front surface of said AC plug about the plug power pins and said one of read and read/write RFID is functioning and communicating said coded RFID signal only when an AC plug affixed with said one of RFID antenna and tag is mated with said AC outlet and a current drain is detected by said measuring circuit.

2. The intelligent AC outlet according to claim 1, wherein one of said read and read/write RFID is communicating said coded signals for at least one of calibrating said measuring circuit and installing said particulars of at least one of said AC outlet and said load.

3. The intelligent AC outlet according to claim 1, wherein said AC outlet is multi sockets outlet and each socket of said sockets including an individual current sensor and said one of read and read/write RFID antenna for individually processing and measuring the power consumed through each said socket by a given load including said identifying and communicating the particulars of each given load.

4. The intelligent AC outlet according to claim 3, wherein a location address and particulars of said AC outlet are set via at least one of setting switch and installed into said memory.

5. The intelligent AC outlet according to claim 4, wherein a location address and particulars of each socket is predefined on the basis of the physical structure of said multi sockets and each socket connection to said CPU.

6. The intelligent AC outlet according to claim 1, wherein said functioning is selected from a group comprising read once only, write once only, read n times, write n times, read at a given schedule, write at a given schedule, read repeatedly and stop upon identifying, read repeatedly and stop upon confirmation, read repeatedly and stop as programmed, write repeatedly and stop upon confirmation, write repeatedly and stop as programmed and combinations thereof.

7. The intelligent AC outlet according to claim 1, wherein said communicating coded optical signal with said second optoport is selected from a group comprising reporting the consumed power, reporting particulars of said load, reporting said load status, reporting particulars of said AC outlet, request for a consumed power data, request for particulars of a load, request for a status of a load, request for data contained in said memory, response to said request and combinations thereof.

8. The intelligent AC outlet according to claim 1, wherein said AC outlet further comprising a third optoport with its optical access positioned onto the front surface of said AC outlet for communicating said coded optical signal by mating with one of an AC plug with said RFID tag and an AC plug assembly with at least one of measuring and communication circuits and a fourth optoport accessed through the front surface of said AC plug assembly, opposite said third optoport.

9. The intelligent AC outlet according to claim 8, wherein said AC plug is an AC plug assembly of an extension power cable with said measuring and communication circuits and with multi sockets, each socket of said sockets including an individual current sensor and said one of read and read/write RFID and antenna for individually identifying and measuring the power consumed through each said socket of said sockets by a given load, wherein said AC plug assembly comprising at least one of an RFID antenna and an optoport for propagating one of optical signal and RFID signal comprising said given load identification along with the power consumed via said each socket by each given load individually and wherein said intelligent outlet further communicating each said load identification and individual consumed power including at least one of summed up total current drained and total power consumed by said extension power cable with said power consumption receiver.

10. The intelligent AC outlet according to claim 1, wherein said AC outlet further comprising a rear fifth optoport for linking said AC outlet to another outlet in a cascaded chain.

11. The intelligent AC outlet according to claim 1, wherein a location address and particulars of said AC outlet are set via at least one of setting switch and installed into said memory.

* * * * *